(12) United States Patent
Chun

(10) Patent No.: US 11,289,560 B2
(45) Date of Patent: Mar. 29, 2022

(54) DISPLAY APPARATUS HAVING A RING DUMMY PATTERN AND A METHOD OF MANUFACTURING THE SAME

(71) Applicant: SAMSUNG DISPLAY CO., LTD., Yongin-si (KR)

(72) Inventor: Jun Chun, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/689,352

(22) Filed: Nov. 20, 2019

(65) Prior Publication Data
US 2020/0212152 A1 Jul. 2, 2020

(30) Foreign Application Priority Data
Dec. 28, 2018 (KR) .................. 10-2018-0171550

(51) Int. Cl.
*H01L 27/32* (2006.01)
*H01L 29/66* (2006.01)
*H01L 29/417* (2006.01)

(52) U.S. Cl.
CPC ...... *H01L 27/3262* (2013.01); *H01L 27/3223* (2013.01); *H01L 27/3276* (2013.01); *H01L 29/41733* (2013.01); *H01L 29/41775* (2013.01); *H01L 29/66757* (2013.01)

(58) Field of Classification Search
CPC ............. H01L 27/3223; H01L 27/3262; H01L 27/3276; H01L 29/41733; H01L 29/41775; H01L 29/66757
See application file for complete search history.

(56) References Cited

U.S. PATENT DOCUMENTS

| 9,147,717 | B2 | 9/2015 | Furuie et al. | |
| 9,711,580 | B2 | 7/2017 | Zhang | |
| 2004/0245523 | A1* | 12/2004 | Jen | H01L 29/41733 257/59 |
| 2008/0012476 | A1* | 1/2008 | Kim | H05B 33/04 313/504 |
| 2008/0067506 | A1* | 3/2008 | Takei | H01L 27/3246 257/40 |
| 2017/0125500 | A1* | 5/2017 | Kim | H01L 27/1259 |

FOREIGN PATENT DOCUMENTS

JP 2017-069589 4/2017

* cited by examiner

*Primary Examiner* — Matthew E Warren
(74) *Attorney, Agent, or Firm* — F. Chau & Associates, LLC

(57) ABSTRACT

A display apparatus including: a base substrate; a first active pattern disposed on the base substrate, a first insulating layer disposed on the first active pattern; a first gate electrode disposed on the first insulating layer; a second insulating layer disposed on the first gate electrode; a ring dummy pattern disposed on the second insulating layer; a third insulating layer disposed on the second insulating layer; and a first drain electrode disposed on the third insulating layer, and electrically connected to the first active pattern through a contact hole which is formed through the third insulating layer, the second insulating layer and the first insulating layer, wherein the first drain electrode is disposed in an opening of the ring dummy pattern.

20 Claims, 24 Drawing Sheets

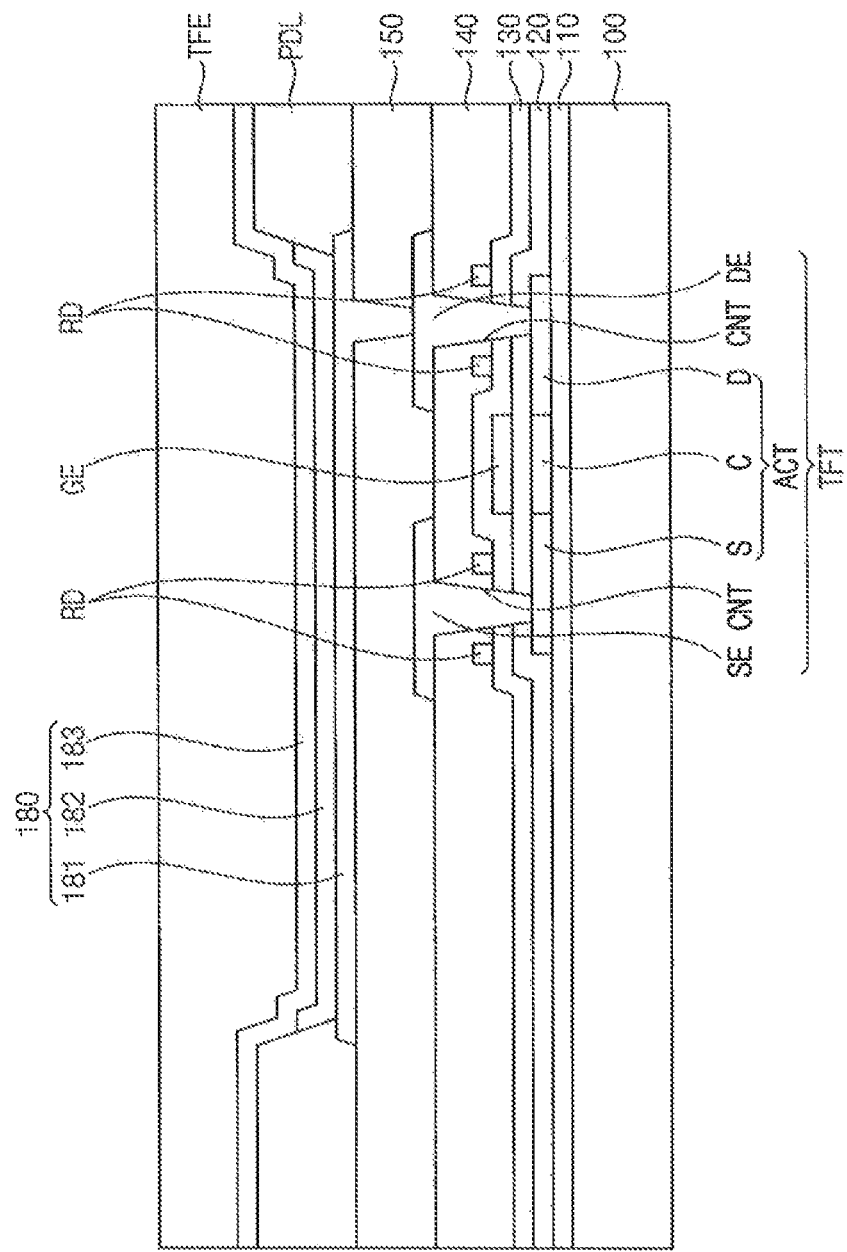

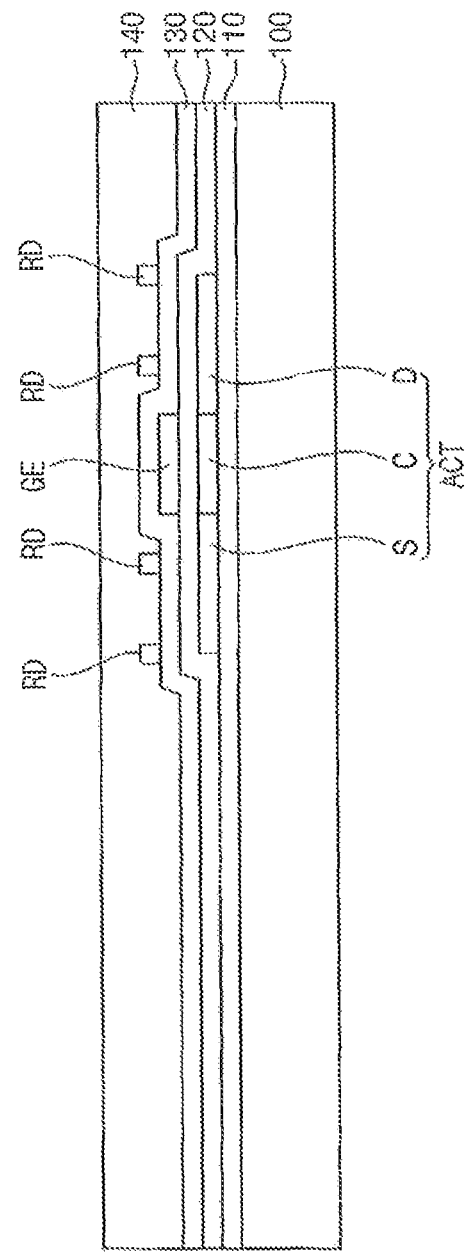

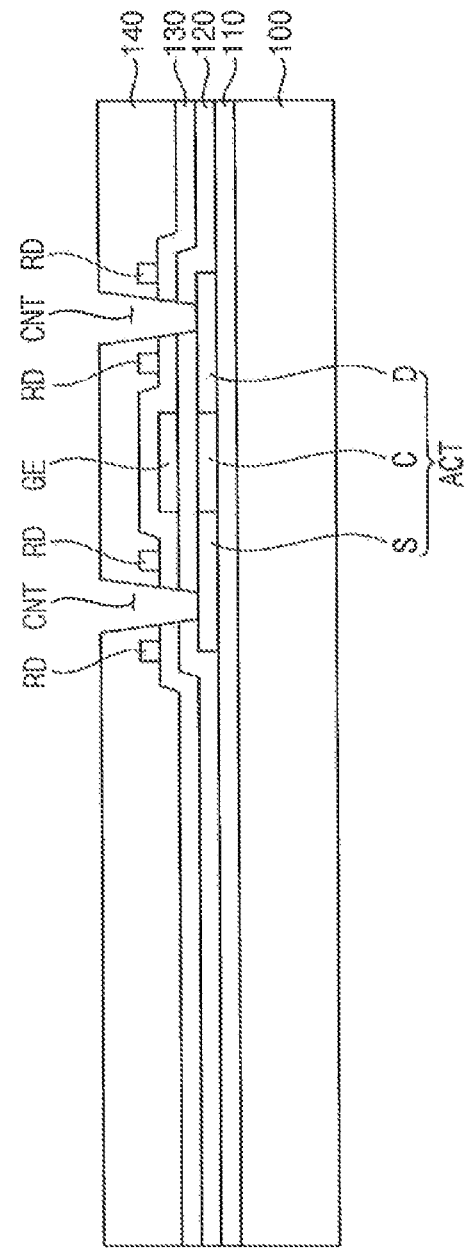

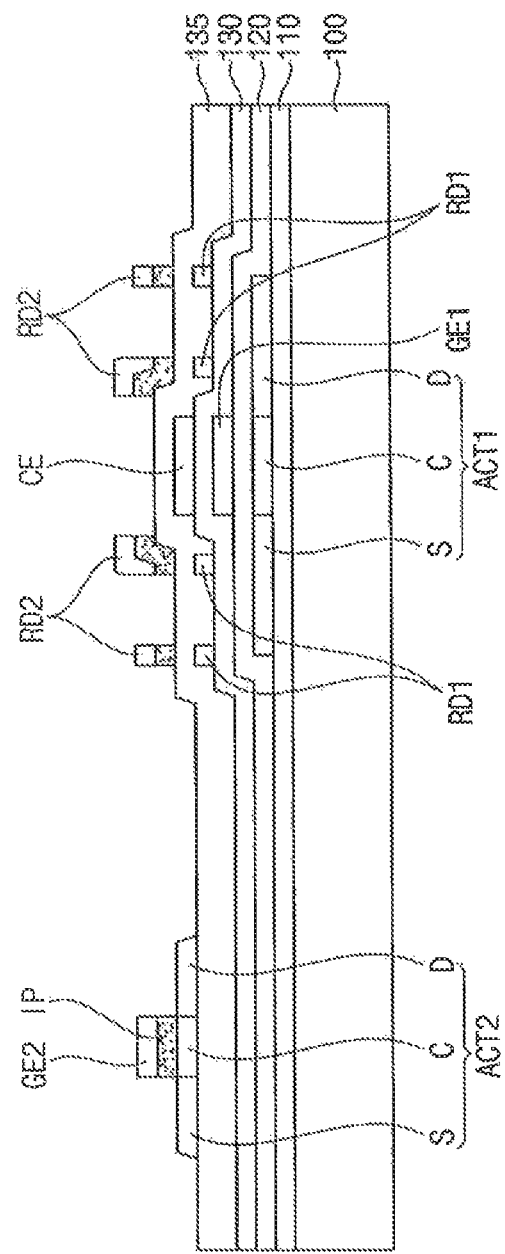

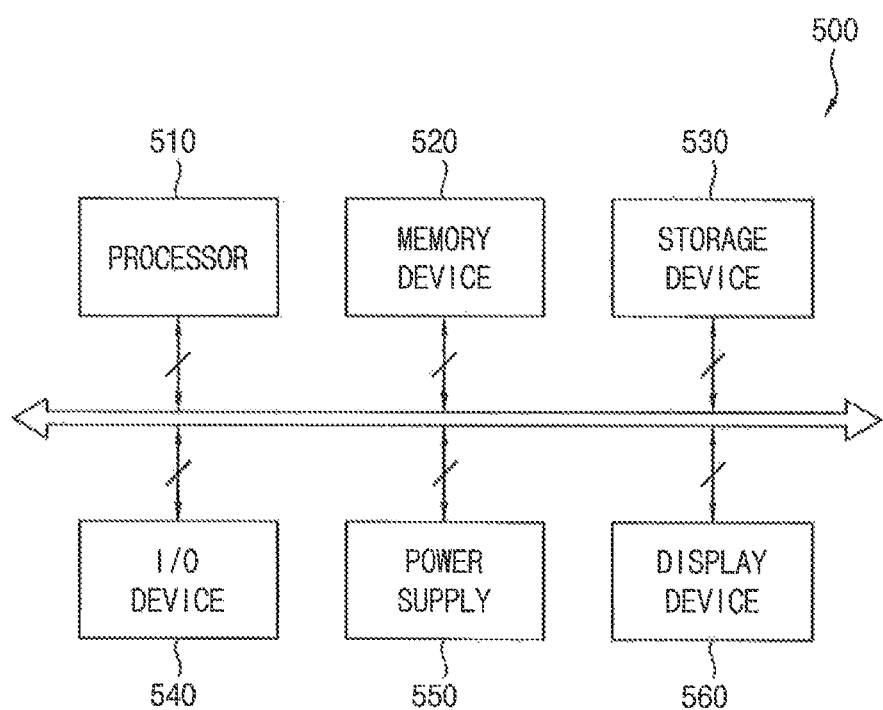

DISPLAY APPARATUS HAVING A RING DUMMY PATTERN AND A METHOD OF MANUFACTURING THE SAME

This application claims priority under 35 U.S.C. § 119 to Korean Patent Application No. 10-2018-0171550, filed on Dec. 28, 2018 the disclosure of which is incorporated by reference herein in its entirety.

Technical Field

Exemplary embodiments of the inventive concept relate to a display apparatus, and a method of manufacturing the display apparatus.

Description of the Related Art

Electronic viewing technologies enable people to see content in a range of entertainment, consumer electronics, personal computer and mobile devices. These electronic viewing technologies may employ a display apparatus such as a plasma display apparatus, a liquid crystal display apparatus or an organic light emitting display apparatus. These display apparatuses are highly regarded due to their small size, light weight and low-power-consumption.

The plasma, liquid crystal or organic light emitting display apparatus may include a base substrate, a plurality of layered structures formed on the base substrate, and a contact structure. As the display apparatus becomes a higher-resolution device, a gap between circuit structures decreases, thereby lowering process margins.

SUMMARY

According to an exemplary embodiment of the inventive concept, a display apparatus includes a base substrate, a first active pattern disposed on the base substrate, a first insulating layer disposed on the first active pattern, a first gate electrode disposed on the first insulating layer, a second insulating layer disposed on the first gate electrode, a first ring dummy pattern disposed on the second insulating layer, a third insulating layer disposed on the second insulating layer, and a first drain electrode disposed on the third insulating layer, and electrically connected to the first active pattern through a first contact hole which is formed through the third insulating layer, the second insulating layer and the first insulating layer, wherein the first drain electrode is disposed in an opening of the first ring dummy pattern.

In an exemplary embodiment of the inventive concept, a periphery of an upper portion of the first contact hole may overlap at least a portion of the first ring dummy pattern in a plan view.

In an exemplary embodiment of the inventive concept, the periphery of the upper portion of the first contact hole may be larger than an inner circumference of the first ring dummy pattern, and smaller than an outer circumference of the first ring dummy pattern.

In an exemplary embodiment of the inventive concept, the first drain electrode and the first ring dummy pattern may contact each other.

In an exemplary embodiment of the inventive concept, the first ring dummy pattern partially may overlap the first gate electrode.

In an exemplary embodiment of the inventive concept, a periphery of a lower portion of the first contact hole may be located in the first ring dummy pattern in a plan view.

In an exemplary embodiment of the inventive concept, the first contact hole may have a shape of a circle, a rectangle, or a square with rounded corners in a plan view. The first ring dummy pattern may have a shape of a circle, a rectangle, or a square with rounded corners in a plan view.

In an exemplary embodiment of the inventive concept, the display apparatus may further include a first interlayer insulating layer disposed between the second insulating layer and the third insulating layer, a second active pattern disposed between the first interlayer insulating layer and the third insulating layer, and a second gate electrode disposed on the second active pattern.

In an exemplary embodiment of the inventive concept, a sum of thicknesses of the first insulating layer, the second insulating layer, the first interlayer insulating layer and the third insulating layer may not be less than 10,000 Å.

In an exemplary embodiment of the inventive concept, the display apparatus may further include a second ring dummy pattern disposed between the first interlayer insulating layer and the third insulating layer and overlapping the first ring dummy pattern.

In an exemplary embodiment of the inventive concept, the display apparatus may further include an insulating pattern disposed between the second ring dummy pattern and the first interlayer insulating layer and between the second gate electrode and the first interlayer insulating layer.

In an exemplary embodiment of the inventive concept, a width of an inner circumference of the second ring dummy pattern may be larger than a width of an inner circumference of the first ring dummy pattern.

In an exemplary embodiment of the inventive concept, the display apparatus may further include a storage electrode overlapping the first gate electrode and spaced apart from the first ring dummy pattern.

In an exemplary embodiment of the inventive concept, the display apparatus may further include an interlayer insulating layer disposed between the third insulating layer and the second insulating layer, and a storage electrode disposed between the interlayer insulating layer and the second insulating layer and overlapping the first gate electrode. The first ring dummy pattern may be disposed between the interlayer insulating layer and the third insulating layer.

In an exemplary embodiment of the inventive concept, the display apparatus may further include an interlayer insulating layer disposed between the third insulating layer and the second insulating layer, a storage electrode disposed between the interlayer insulating layer and the second insulating layer and overlapping the first gate electrode. The first ring dummy pattern may be disposed between the interlayer insulating layer and the second insulating layer, and in the same layer as the storage electrode.

In an exemplary embodiment of the inventive concept, the display apparatus may further include a via insulating layer disposed on the third insulating layer, and a light emitting layer disposed on the via insulating layer.

In an exemplary embodiment of the inventive concept, the first drain electrode may be electrically connected to the second active pattern through a second contact hole formed through the third insulating layer. The first contact hole and the second contact hole may be disposed adjacent to each other in a plan view. The second contact hole may not be provided with the first dummy pattern corresponding to the first contact hole.

According to an exemplary embodiment of the inventive concept, a method of manufacturing a display apparatus includes forming a first active pattern on a base substrate, forming a first insulating layer on the first active pattern, forming a first gate electrode on the first insulating layer, forming a second insulating layer on the first gate electrode, forming a first ring dummy pattern on the second insulating layer, the first ring dummy pattern overlapping the first active pattern, forming a third insulating layer on the first ring dummy pattern, forming a contact hole, which exposes a portion of the first active pattern, by penetrating the third insulating layer, a hole of the first ring dummy pattern, the second insulating layer, and the first insulating layer in order, and forming a drain electrode electrically connected to the first active pattern by filling the contact hole.

In an exemplary embodiment of the inventive concept, a depth of the contact hole may not be less than 10,000 Å.

In an exemplary embodiment of the inventive concept, the method may further include forming an interlayer insulating layer on the second insulating layer before forming the third insulating layer, and forming a second ring dummy pattern overlapping the first ring dummy pattern on the interlayer insulating layer. The contact hole may be formed by partially removing the third insulating layer, a portion of the second ring dummy pattern, the interlayer insulating layer, a portion of the ring dummy pattern, the second insulating layer, and the first insulating layer in order.

According to an exemplary embodiment of the inventive concept, a display apparatus includes a base substrate, a first conductive pattern disposed on the base substrate, a first insulating layer disposed on the first conductive pattern, a second conductive pattern disposed on the first insulating layer, a second insulating layer disposed on second conductive pattern, a ring dummy pattern disposed on the second insulating layer, a third insulating layer disposed on the ring dummy pattern, and a third conductive pattern disposed on the third insulating layer. A contact hole may be formed through the third insulating layer, the second insulating layer, and the first insulating layer, and the contact hole passes through an opening of the ring dummy pattern. The third conductive pattern may be disposed in the contact hole, and electrically connected to the first conductive pattern.

BRIEF DESCRIPTION OF THE DRAWINGS

The above and other features of the inventive concept will become more apparent by describing in detail exemplary embodiments thereof with reference to the accompanying drawings, in which:

FIG. 1 is a cross-sectional view illustrating a display apparatus according to an exemplary embodiment of the inventive concept;

FIGS. 10A, 10B, 10C and 10D are cross-sectional views illustrating a manufacturing method of the display apparatus of FIG. 1;

FIGS. 11A, 11B, 11C and 11D are cross-sectional views illustrating a manufacturing method of the display apparatus of FIG. 5;

FIG. 13 is a block diagram illustrating an electronic device according to exemplary embodiments of the inventive concept;

DETAILED DESCRIPTION OF THE EMBODIMENTS

Figure 2A:
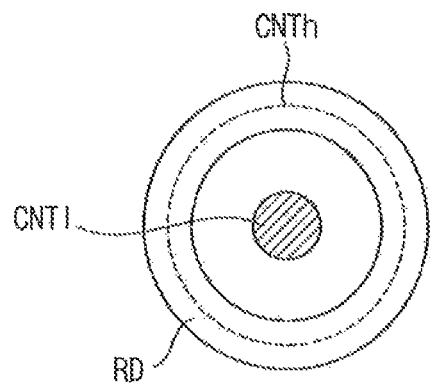
FIG. 2A is a plan view illustrating a contact hole and a ring dummy pattern of the display apparatus of FIG. 1.

Hereinafter, exemplary embodiments of the inventive concept will be explained in detail with reference to the accompanying drawings.

FIG. 1 is a cross-sectional view illustrating a display apparatus according to an exemplary embodiment of the inventive concept.

Referring to FIG. 1, the display apparatus may include a base substrate 100, a buffer layer 110, an active pattern ACT, a first gate insulating layer 120, a first gate pattern, a second gate insulating layer 130, a second gate pattern, an interlayer insulating layer 140, a data pattern, a via insulating layer 150, a pixel defining layer PDL, a light emitting structure 180, and a thin film encapsulation layer TFE.

The base substrate 100 may include transparent or opaque insulation materials. For example, the base substrate 100 may include a quartz substrate, a synthetic quartz substrate, a calcium fluoride substrate, a fluoride-doped quartz substrate, a sodalime glass substrate, a non-alkali glass substrate etc. Alternatively, the base substrate 100 may include a flexible transparent material such as a flexible transparent resin substrate (e.g., a polyimide substrate). In this case, the polyimide substrate may include a first polyimide layer, a barrier film layer, a second polyimide layer, etc. For example, the polyimide substrate may have a configuration where the first polyimide layer, the barrier film layer, and the second polyimide layer, are stacked on a rigid glass substrate.

The buffer layer 110 may be disposed on the entire base substrate 100. The buffer layer 110 may prevent the diffusion of metal atoms and/or impurities from the substrate 100 into the active pattern ACT. In addition, the buffer layer 110 may control a rate of heat transfer in a crystallization process for forming the active pattern ACT, thereby obtaining a substantially uniform active pattern ACT. In addition, the buffer layer 110 may increase flatness of a surface of the base substrate 100 when the surface of the base substrate 100 is not uniform.

The active pattern ACT may be disposed on the buffer layer 110. The active pattern ACT may include poly crystal silicon. The active pattern ACT may include a drain region D and a source region S doped with an impurity and a channel region C between the drain region D and the source region S. The poly crystal silicon may be formed by first depositing amorphous silicon and then crystallizing the amorphous silicon. In some embodiments of the inventive concept, the active pattern ACT may include an amorphous silicon or an oxide semiconductor.

The first gate insulating layer 120 may cover the active pattern ACT on the buffer layer 110 and may be disposed at substantially the same thickness along a profile of the active pattern ACT. The first gate insulating layer 120 may include an inorganic insulating material such as a silicon compound or a metal oxide.

The first gate pattern may be disposed on the first gate insulating layer 120. The first gate pattern may include a gate electrode GE. The first gate pattern may further include a signal line such as a gate line for driving the display apparatus. The first gate pattern may be formed using a metal, an alloy, a metal nitride, a conductive metal oxide, a transparent conductive material, or the like.

The second gate insulating layer 130 may be disposed on the first gate insulating layer 120 on which the first gate pattern is disposed. The second gate insulating layer 130 may cover the first gate pattern on the first gate insulating layer 120 and may be disposed at substantially the same thickness along a profile of the first gate pattern. The second gate insulating layer 130 may include an inorganic insulating material such as a silicon compound or a metal oxide.

The second gate pattern may be disposed on the second gate insulating layer 130. The second gate pattern may include a ring dummy pattern RD. The ring dummy pattern RD may be disposed on the drain region D and the source region S of the active pattern ACT, respectively. For example, in the cross-section of FIG. 1, portions of the ring dummy pattern RD may be opposite each other. The ring dummy pattern RD may have a ring shape having a central hole in a plan view, and a detailed description thereof will be described later with reference to FIG. 2.

The interlayer insulating layer 140 may be disposed on the second gate insulating layer 130 on which the second gate pattern is disposed. The interlayer insulating layer 140 may cover the second gate pattern on the second gate insulating layer 130, and may have a substantially flat upper surface without a step around the second gate pattern. The interlayer insulating layer 140 may include an inorganic insulating material such as a silicon compound or a metal oxide.

The data pattern may be disposed on the interlayer insulating layer 140. The data pattern may include a source electrode SE and a drain electrode DE. The source electrode SE and the drain electrode DE may be electrically connected to the source region S and the drain region D of the active pattern ACT through a contact hole CNT formed through the interlayer insulating layer 140, the second gate insulating layer 130 and the first gate insulating layer 120. The active pattern ACT, the gate electrode GE, the source electrode SE and the drain electrode DE may be included in a thin film transistor TFT.

In FIG. 1, the contact hole CNT may pass through the hole of the ring dummy pattern RD so that a portion of the source electrode SE and a portion of the drain electrode DE may be formed through the hole of the ring dummy pattern RD. In other words, the source electrode SE and the drain electrode DE may be disposed in respective contact holes CNT.

The via insulating layer 150 may be disposed on the interlayer insulating layer 140 on which the data pattern is disposed. The via insulating layer 150 may have a single-layer structure, but may have a multi-layer structure including at least two insulating layers. The via insulating layer 150 may be formed using an organic material such as a photoresist, an acrylic resin, a polyimide resin, a polyamide resin, or a siloxane-based resin.

The light emitting structure 180 may include a first electrode 181, a light emitting layer 182 and a second electrode 183.

The first electrode 181 may be disposed on the via insulating layer 150. The first electrode 181 may be electrically connected to the drain electrode DE of the thin film transistor TFT through a contact hole formed through the via insulating layer 150. The first electrode 181 may include a reflective material or a transmissive material depending on the emission type of the display apparatus. In exemplary embodiments of the inventive concept, the first electrode 181 may have a single layer structure or a multi layer structure, which may include a metal film, an alloy film, a metal nitride film, a conductive metal oxide film and/or a transparent conductive film.

The pixel defining layer PDL may be disposed on the via insulating layer 150 on which the first electrode 181 is disposed. The pixel defining layer PDL may be formed using an organic material. For example, the pixel defining layer PDL may include photoresist, acryl-based resin, polyimide-based resin, polyamide-based resin, siloxane-based resin, etc. In some exemplary embodiments of the inventive concept, an opening which exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to an emitting area, and a non-emitting area may correspond to a portion adjacent to the opening of the pixel defining layer PDL.

The light emitting layer 182 may be disposed on the first electrode 181 exposed through the opening of the pixel defining layer PDL. In addition, the light emitting layer 182 may extend on a sidewall of the opening of the pixel defining layer PDL. In some exemplary embodiments of the inventive concept, the light emitting layer 182 may include an organic light emitting layer (EL), a hole injection layer (HIL), a hole transport layer (HTL), an electron transport layer (ETL), an electron injection layer (EIL), etc. In some exemplary embodiments of the inventive concept, except for the organic light emitting layer (EL), the hole injection layer (HIL), the hole transport layer (HTL), the electron transport layer (ETL), and the electron injection layer (EIL) may be formed in common to correspond to a plurality of pixels. In some exemplary embodiments of the inventive concept, a plurality of organic light emitting layers may be formed using light emitting materials for generating different colors of light such as red, green and blue in accordance with color pixels of the display apparatus. In some exemplary embodiments of the inventive concept, the organic light emitting layer (EL) of the light emitting layer 182 may include a plurality of stacked light emitting materials for generating a red light, a green light and a blue light to thereby emitting a white light. Here, elements of the light emitting layer 182 are commonly formed to correspond to a plurality of pixels, and each pixel can be divided by a color filter layer.

The second electrode 183 may be disposed on the pixel defining layer PDL and the light emitting layer 182. The second electrode 183 may include a transmissive material or a reflective material in accordance with the emission type of the display apparatus. In exemplary embodiments of the inventive concept, the second electrode 183 may also have a single layer structure or a multi layer structure, which may include a metal film, an alloy film, a metal nitride film, a conductive metal oxide film and/or a transparent conductive film.

The thin film encapsulation layer TFE may be disposed on the second electrode 183. The thin film encapsulation layer TFE may prevent penetration of moisture and oxygen from the outside. The thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer therebetween, but is not limited thereto. In some exemplary embodiments of the inventive concept, a sealing substrate for shielding outside air and moisture from penetrating into the display apparatus may be provided instead of the thin film encapsulation layer TFE.

FIG. 2A is a plan view illustrating a contact hole CNT and a ring dummy pattern RD of the display apparatus of FIG. 1.

Referring to FIGS. 1 and 2A, the ring dummy pattern RD may have a ring shape with a central hole in a plan view. For example, the ring dummy pattern RD may have an opening in the plan view. An upper periphery of the contact hole CNT (also see CNTh in FIG. 3A) may be larger than an inner circumference of the ring dummy pattern RD, and may be smaller than an outer circumference of the ring dummy pattern RD. A lower portion of the contact hole CNT (CNT1), which is a surface where the source or drain electrode SE or DE is in contact with the active pattern ACT, may be located inside of the inner circumference of the ring dummy pattern RD in a plan view, in other words, the lower portion of the contact hole CNT (CNT1) may be disposed in the opening of the ring dummy pattern RD.

Figure 2B:
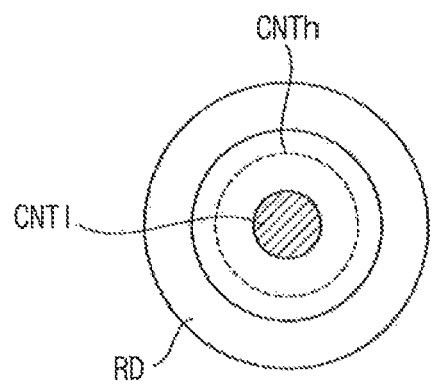
FIG. 2B is a plan view illustrating another example of a contact hole and a ring dummy pattern of the display apparatus of FIG. 1.

FIG. 2B is a plan view illustrating another example of a contact hole CNT and a ring dummy pattern RD of the display apparatus of FIG. 1.

Referring to FIG. 2B, the display apparatus is substantially the same as the display apparatus of FIGS. 1 and 2A except that the upper periphery CNTh of the contact hole CNT is smaller than the inner circumference of the ring dummy pattern RD. The size of the contact hole CNT may be variously set as desired.

Figure 3A:
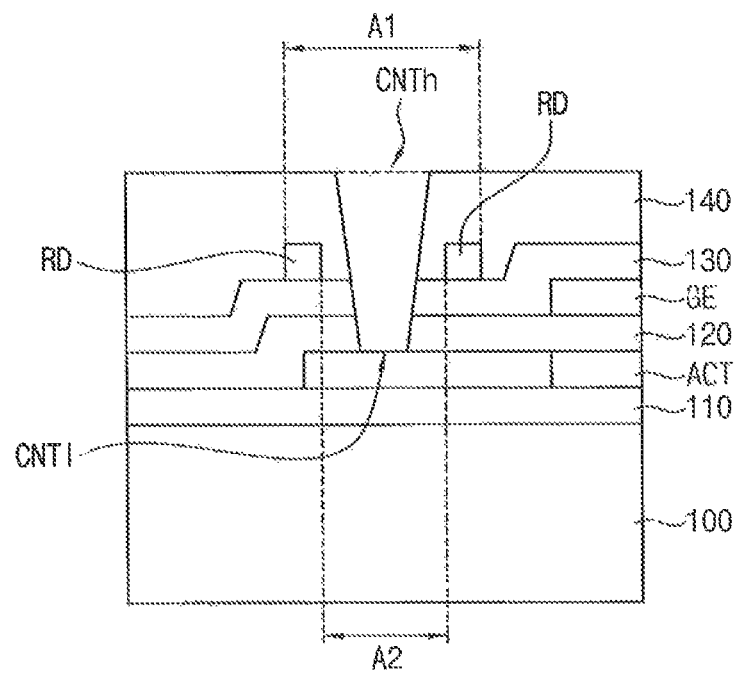
FIGS. 3A, 3B, and 3C are partial cross-sectional views for explaining a function of the ring dummy pattern of the display apparatus of FIG. 1.
Figure 3B:
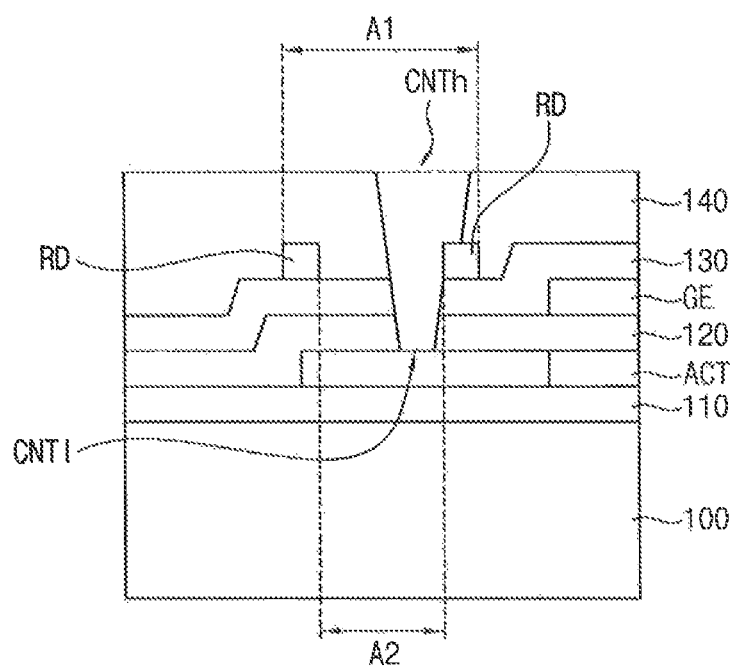
Figure 3C:
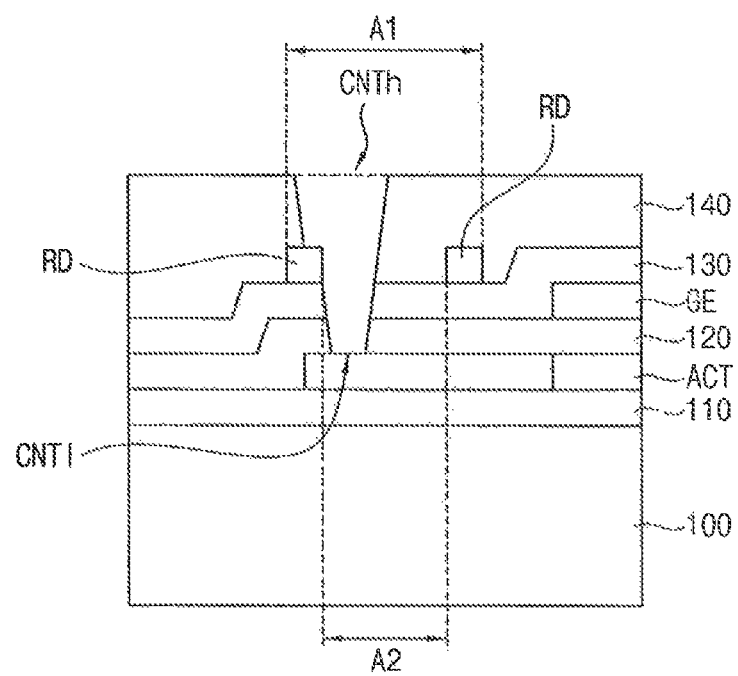

FIGS. 3A, 3B, and 3C are partial cross-sectional views for explaining a function of the ring dummy pattern RD of the display apparatus of FIG. 1.

Referring to FIGS. 1 and 3A, a case where the contact hole CNT is formed at a predetermined position is shown. The contact hole CNT passes through the inner circumference of the ring dummy pattern RD so that the ring dummy pattern RD and the source or drain electrodes SE or DE do not contact each other.

The upper periphery CNTh of the contact hole CNT having a width smaller than a width A1 of an outer circumference of the ring dummy pattern RD is formed. The lower portion of the contact hole CNT1 having a width smaller than a width A2 of the inner circumference of the ring dummy pattern RD may be formed on the source or drain region S or D of the active pattern ACT.

Referring to FIGS. 1, 3B and 3C, a case where the contact hole CNT is formed out of a predetermined position is shown. For example, FIG. 3B shows a case where the contact hole CNT shifted to right, and FIG. 3C is a case where the contact hole CNT is shifted to left.

The contact hole CNT exposes a portion of the ring dummy pattern RD so that the ring dummy pattern RD and the source or drain electrodes SE or DE contact each other. For example, since the ring dummy pattern RD is exposed within the contact hole CNT, when the source or drain electrode SE or DE is filled in the contact hole CNT, it can make direct contact with the exposed portion of the ring dummy pattern RD.

The upper periphery CNTh of the contact hole CNT is disposed in the width A1 of the outer circumference of the ring dummy pattern RD. The lower portion of the contact hole CNT1 is located in the inner circumference of the ring dummy pattern RD, and may be formed on the source or drain region S or D of the active pattern ACT. Thus, the lower portion of the contact hole CNT1 can be formed at a desired position even if a formation position of the contact hole CNT is slightly shifted by a process error. In addition, the ring dummy pattern RD is a floating pattern, and thus, may not cause defects even if it contacts the source electrode or the drain electrode SE or DE. In addition, since the inner periphery of the annular dummy pattern RD is spaced apart from the gate electrode GE in a plan view, even if the formation position of the contact hole CNT is deviated toward the gate electrode GE, there is no possibility that the drain electrode DE comes into contact with the gate electrode GE to cause a short circuit.

In addition, a contact position of the source or drain electrode SE or DE with the active pattern. ACT through the contact hole CNT can be determined by the position of the ring dummy pattern RD, the width A1 of the outer circumference and the width A2 of the inner circumference. For example, an accuracy of a patterning process of a conductive pattern is superior to that of the contact hole forming process, and therefore, the process margin of forming the contact hole CNT can be sufficiently secured.

Figure 4:
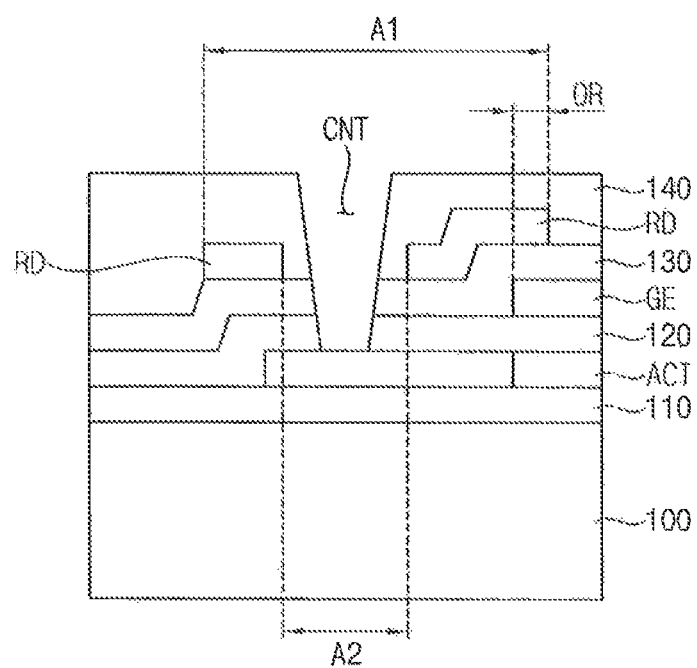
FIG. 4 is a partial cross-sectional view for explaining another example of the contact hole and the ring dummy pattern of the display apparatus of FIG. 1.

FIG. 4 is a partial cross-sectional view for explaining another example of the contact hole CNT and the ring dummy pattern RD of the display apparatus of FIG. 1.

Referring to FIG. 4, the display apparatus is substantially the same as the display apparatus of FIGS. 1 to 3C except for a size and position of the ring dummy pattern RD. Therefore, a repeated explanation will be omitted.

According to the present embodiment, a portion of the ring dummy pattern RD may be arranged to overlap the gate electrode GE, but the inner circumference of the ring dummy pattern RD may be spaced apart from the gate electrode GE in a plan view. Therefore, it is possible to minimize a distance between the contact hole CNT and the gate electrode GE while preventing a short circuit. Accordingly, a size of the thin film transistor TFT including the gate electrode GE can be reduced, and a space margin for circuit design of the display apparatus can be secured, so that defects can be prevented.

Figure 5:
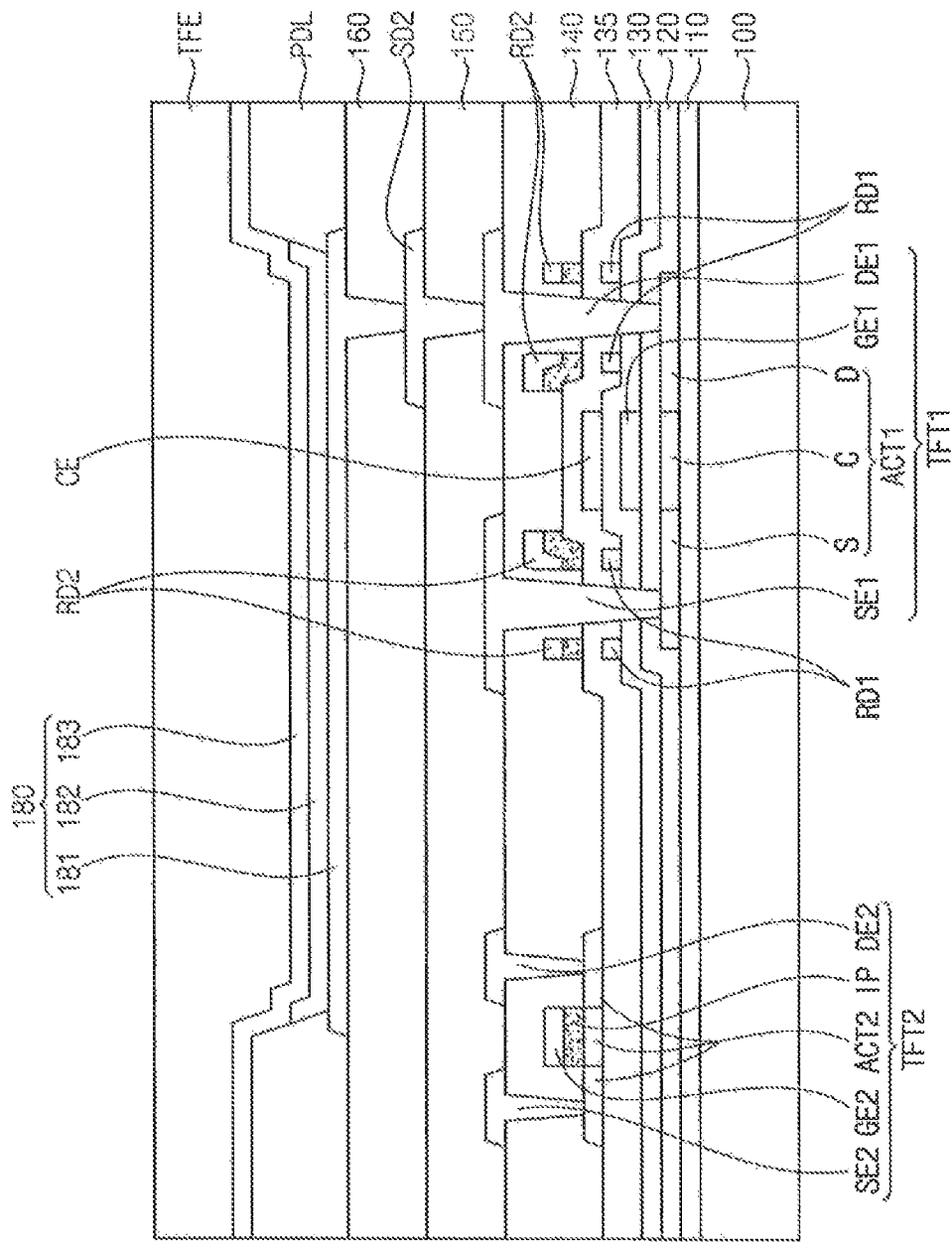
FIG. 5 is a cross-sectional view illustrating a display apparatus according to an exemplary embodiment of the inventive concept.

FIG. 5 is a cross-sectional view illustrating a display apparatus according to an exemplary embodiment of the inventive concept.

Referring to FIG. 5, the display apparatus may include a base substrate 100, a buffer layer 110, a first active pattern ACT1, a first gate insulating layer 120, a first gate pattern, a second gate insulating layer 130, a second gate pattern, a first interlayer insulating layer 135, a second active pattern ACT2, an insulating pattern IP, a third gate pattern, a second interlayer insulating layer 140, a first data pattern, a first via insulating layer 150, a second data pattern, a second via insulating layer 160, a pixel defining layer PDL, a light emitting structure 180, and a thin film encapsulation layer TFE.

The base substrate 100 may be made of a transparent or opaque material. The buffer layer 110 may be disposed entirely on the base substrate 100. The base substrate 100 and the buffer layer 110 are substantially the same as the base substrate and the buffer layer of the display apparatus FIG. 1, and therefore, a detailed description thereof will be omitted.

The first active pattern ACT1 may be disposed on the buffer layer 110. The first active pattern ACT1 may include poly crystal silicon. The first active pattern ACT1 may include a drain region D and a source region S doped with impurities and a channel region C between the drain region D and the source region S.

The first gate insulating layer 120 may cover the first active pattern ACT1 on the buffer layer 110 and may be disposed at substantially the same thickness along a profile of the first active pattern ACT1.

The first gate pattern may be disposed on the first gate insulating layer 120. The first gate pattern may include a first gate electrode GE1.

The second gate insulating layer 130 may be disposed on the first gate insulating layer 120 on which the first gate pattern is disposed. The second gate insulating layer 130 may cover the first gate pattern on the first gate insulating layer 120 and may be disposed at substantially the same thickness along a profile of the first gate pattern.

The second gate pattern may be disposed on the second gate insulating layer 130. The second gate pattern may include a storage electrode CE and a first ring dummy pattern RD1.

The storage electrode CE may overlap the first gate electrode GE1. The storage electrode CE may form a storage capacitor together with the first gate electrode GE1 and the second gate insulating layer 130 therebetween.

The first ring dummy pattern RD1 may be disposed on the drain region D and the source region S of the first active pattern ACT1, respectively. The first ring dummy pattern RD1 may have a ring shape having a central hole in a plan view. The first ring dummy pattern RD1 may be spaced apart from the storage electrode CE.

The first interlayer insulating layer 135 may be disposed on the second gate insulating layer 130 on which the second gate pattern is disposed. The first interlayer insulating layer 135 may cover the second gate pattern on the second gate insulating layer 130 and may be disposed at substantially the same thickness along a profile of the second gate pattern.

The second active pattern ACT2 may be disposed on the first interlayer insulating layer 135. The second active pattern ACT2 may include an oxide semiconductor. The oxide semiconductor may be formed of any one of indium (In), zinc (Zn), gallium (Ga), tin (Sn), titanium (Ti), aluminum (Al), hafnium (Hf), zirconium (Zr), magnesium (ABx), a ternary compound (ABxCy), a quaternary compound (ABxCyDz), and the like. For example, the oxide semiconductor may be formed of at least one selected from the group consisting of zinc oxide (ZnOx), gallium oxide (GaOx), titanium oxide (TiOx), tin oxide (SnOx), indium oxide (InOx), indium-gallium oxide (IGO), indium zinc oxide (IZO), indium tin oxide (ITO), gallium-zinc oxide (GZO), zinc-magnesium oxide (ZMO), zinc-tin oxide (ZTO), zinc-zirconium oxide (ZnZrxOy), indium-gallium zinc oxide (IGZO), indium-zinc-tin oxide (IZTO), indium-gallium-hafnium oxide (IGHO), tin-aluminum-zinc oxide (TAZO) and indium-gallium-tin oxide (IGTO).

The second active pattern ACT2 may include a drain region D and a source region S doped with an impurity and a channel region C between the drain region D and the source region S.

The third gate pattern may be disposed on the first interlayer insulating layer 135 on which the second active pattern ACT2 is disposed. The insulating pattern IP may be disposed between the third gate pattern and the first interlayer insulating layer 135. The insulating pattern IP may have substantially the same planar shape as the third gate pattern. The third gate pattern may include a second gate electrode GE2 and a second ring dummy pattern RD2.

The second gate electrode GE2 may be disposed on the second active pattern ACT2 to overlap the channel region C of the second active pattern ACT2.

The second ring dummy pattern RD2 may overlap the first ring dummy pattern RD1. The second ring dummy pattern RD2 may have a ring shape having a center hole in a plan view, and may have the same shape as the first ring dummy pattern RD1.

The second interlayer insulating layer 140 may be disposed on the first interlayer insulating layer 135 on which the third gate pattern is disposed. The second interlayer insulating layer 140 may cover the third gate pattern on the first interlayer insulating layer 135 and may have a substantially flat upper surface without forming a step around the third gate pattern.

The first data pattern may be disposed on the second interlayer insulating layer 140.

The first data pattern may include a first source electrode SE1 and a first drain electrode DE1. The first source electrode SE1 and the first drain electrode DE1 may be electrically connected to the source region S and the drain region D of the first active pattern ACT1 through a contact hole formed through the second interlayer insulating layer 140, the first interlayer insulating layer 135, the second gate insulating layer 130, and the first gate insulating layer 120, respectively. The first active pattern ACT1, the first gate electrode GE1, the first source electrode SE1 and the first drain electrode DE1 may be included in a first thin film transistor TFT1.

In FIG. 5, the contact hole is formed to pass through a hole of the second ring dummy pattern RD2 and a hole of the first ring dummy pattern RD1 in order. In this case, a portion of the first source electrode SE1 and a portion of the first drain electrode DE1 may pass through the holes of the first and second ring dummy patterns RD1 and RD2. Thus, defects can be prevented by the first and second ring dummy patterns RD1 and RD2 even if the positions of the contact holes are slightly shifted by process errors.

Still referring to FIG. 5, a depth of the contact hole may be equal to or greater than a sum of thicknesses of the first gate insulating layer 120, the second gate insulating layer 130, the first interlayer insulating layer 135, and the second interlayer insulating layer 140. In the case where the depth of the contact hole is relatively deep, for example, the depth is 10,000 angstroms or more, an effect by the first and/or second ring dummy patterns RD1 and RD2 can be increased. In other words, even when the depth of the contact hole is relatively deep, since the formation position of the contact hole is limited by the first and second ring dummy patterns RD1 and RD2, defects caused by an error in the formation of the contact hole can be reduced.

The first data pattern may further include a second source electrode SE2 and a second drain electrode DE2. The second source electrode SE2 and the second drain electrode DE2 may be electrically connected to the source region S and the drain region D of the second active pattern ACT2 through a contact hole formed through the second interlayer insulating layer 140, respectively. The second active pattern ACT2, the second gate electrode GE2, the second source electrode SE2 and the second drain electrode DE2 may be included in a second thin film transistor TFT2.

The first via insulating layer 150 may be disposed on the second interlayer insulating layer 140 on which the first data pattern is disposed. The first via insulating layer 150 may have a single-layer structure, but may have a multi-layer structure including at least two insulating layers. The first via insulating layer 150 may be formed using an organic material such as a photoresist, an acrylic resin, a polyimide resin, a polyamide resin, or a siloxane-based resin.

The second data pattern may be disposed on the first via insulating layer 150. The second data pattern may include a connecting electrode SD2. The connecting electrode SD2 may be connected to the first drain electrode DE1 of the first thin film transistor TFT1 through a contact hole formed through the first via insulating layer 150.

The second via insulating layer 160 may be disposed on the first via insulating layer 150 in which the second data pattern is disposed. The second via insulating layer 160 may have a single-layer structure, but may have a multi-layer structure including at least two insulating layers. The second via insulating layer 160 may be formed using an organic material such as a photoresist, an acrylic resin, a polyimide resin, a polyamide resin, or a siloxane-based resin.

The light emitting structure 180 may include a first electrode 181, a light emitting layer 182, and a second electrode 183.

The first electrode 181 may be disposed on the second via insulating layer 160. The first electrode 181 may be connected to the connection electrode SD2 through a contact hole formed through the second via insulating layer 160. The pixel defining layer PDL may be disposed on the second via insulating layer 160 on which the first electrode 181 is disposed. The light emitting layer 182 may be disposed on the first electrode 181 exposed through an opening of the pixel defining layer PDL. The second electrode 183 may be disposed on the pixel defining layer PDL and the light emitting layer 182. The thin film encapsulation layer TFE may be disposed on the second electrode 183.

The light emitting structure 180 and the thin film encapsulation layer TFE are substantially the same as the light emitting structure and the thin encapsulation layer of the display device of FIG. 1; therefore, a detailed description thereof will be omitted.

Figure 6:
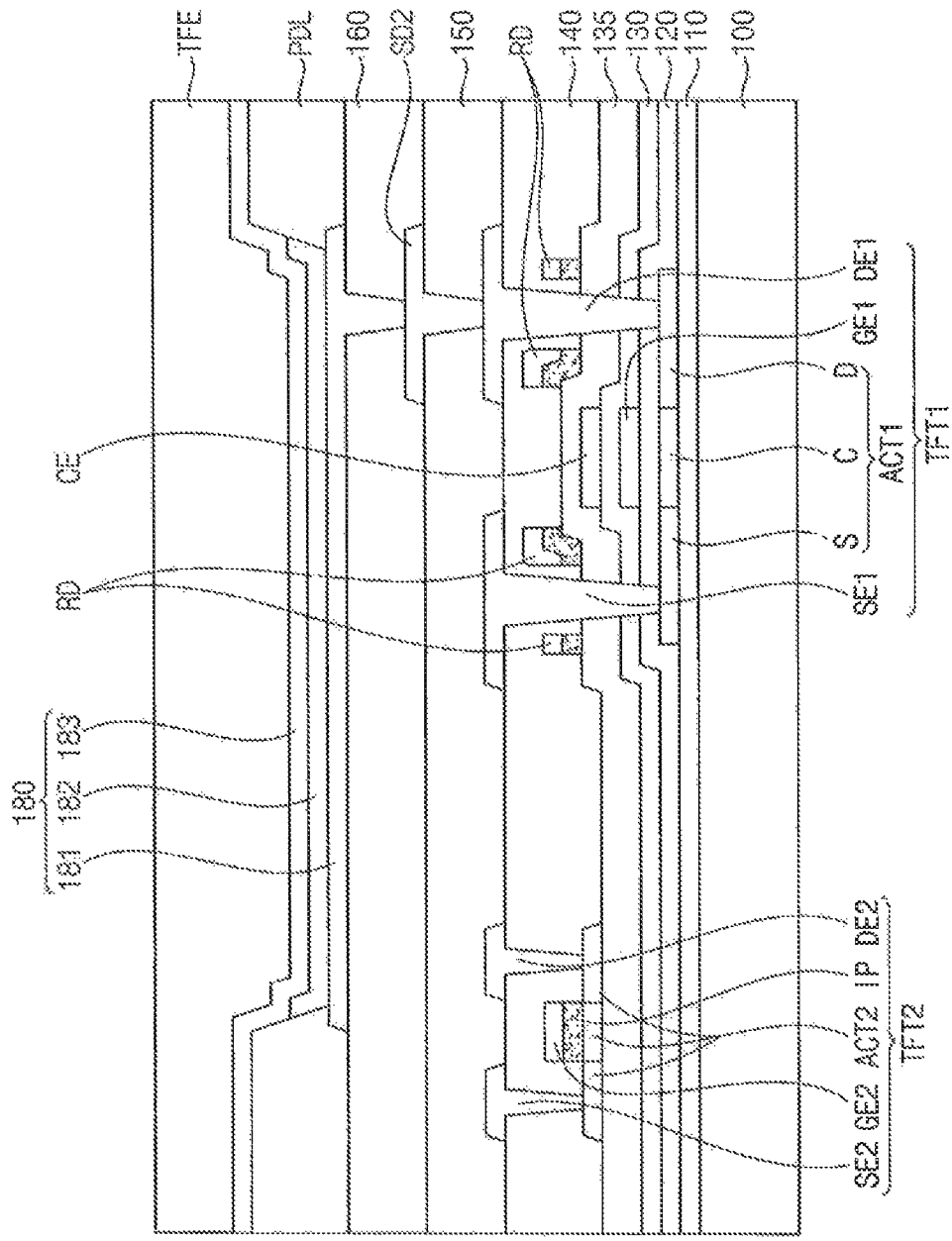
FIG. 6 is a cross-sectional view illustrating a display apparatus according to an exemplary embodiment of the inventive concept.

FIG. 6 is a cross-sectional view illustrating a display apparatus according to an exemplary embodiment of the inventive concept.

Referring to FIG. 6, the display apparatus is substantially the same as the display apparatus of FIG. 5 except that a ring dummy pattern RD is formed on only one layer. Therefore, a repeated explanation will be omitted.

The display apparatus may include a base substrate 100, a buffer layer 110, a first active pattern ACT1 of a first thin film transistor TFT1, a first gate insulating layer 120, a first gate pattern, a second gate insulating layer 130, a second gate pattern, a first interlayer insulating layer 135, a second active pattern ACT2 of a second thin film transistor TFT2, an insulating pattern IP, a third gate pattern, a second interlayer insulating layer 140, a first data pattern, a first via insulating layer 150, a second data pattern, a second via insulating layer 160, a pixel defining layer PDL, a light emitting structure 180, and a thin film encapsulation layer TFE.

The first gate pattern may include a first gate electrode GE1. The second gate pattern may include a storage electrode CE.

The third gate pattern may include a second gate pattern GE2 and the ring dummy pattern RD. The ring dummy pattern RD may have a ring shape with a central hole in a plan view.

The first data pattern may include a first source electrode SE1, a first drain electrode DE1, a second source electrode SE2, and a second drain electrode DE2. The second data pattern may include a connecting electrode SD2.

Figure 7:
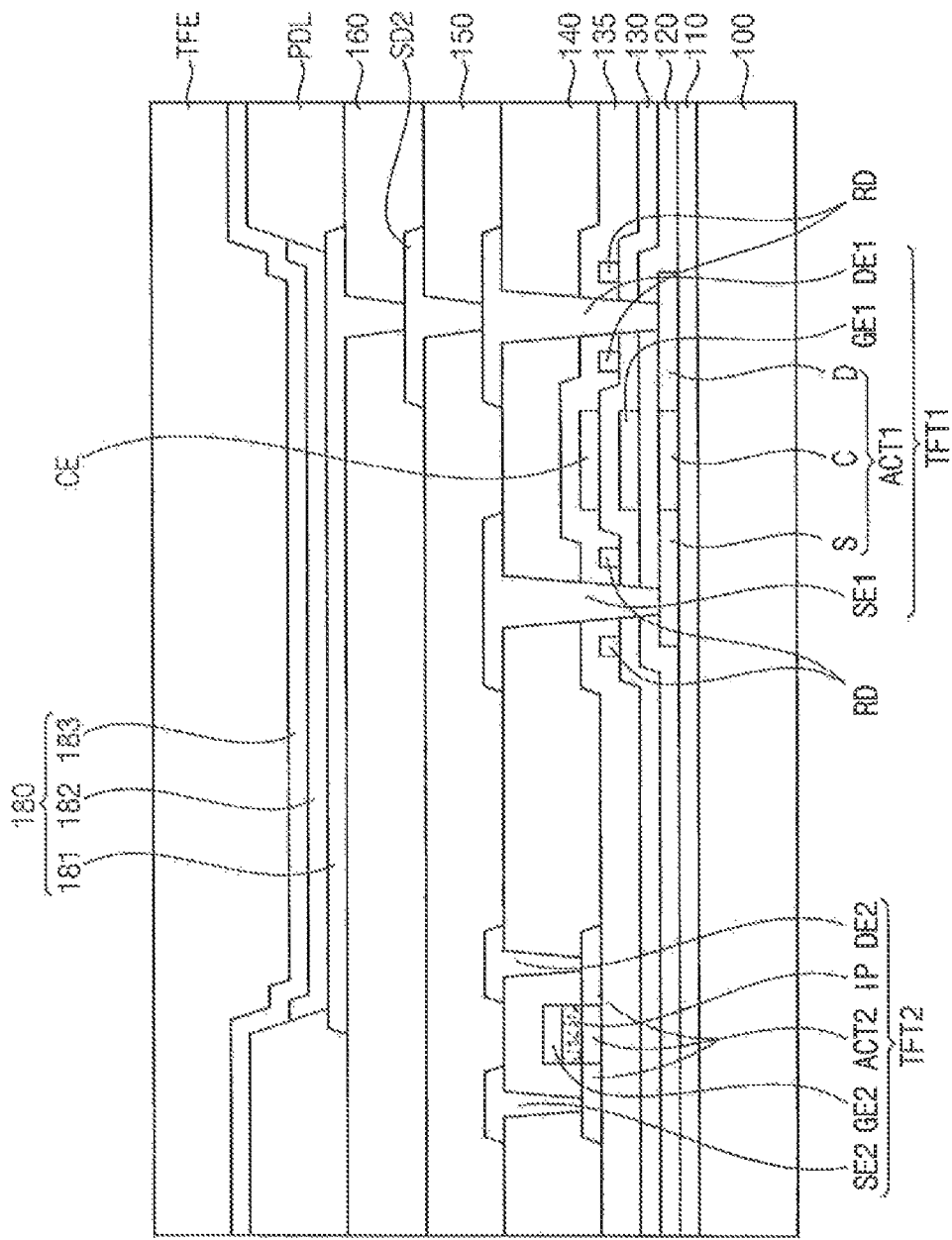
FIG. 7 is a cross-sectional view illustrating a display apparatus according to an exemplary embodiment of the inventive concept.

FIG. 7 is a cross-sectional view illustrating a display apparatus according to an exemplary embodiment of the inventive concept.

Referring to FIG. 7, the display apparatus is substantially the same as the display apparatus of FIG. 5 except that a ring dummy pattern RD is formed in only one layer. Therefore, a repeated explanation will be omitted.

The display apparatus may include a base substrate 100, a buffer layer 110, a first active pattern ACT1 of a first thin film transistor TFT1, a first gate insulating layer 120, a first gate pattern, a second gate insulating layer 130, a second gate pattern, a first interlayer insulating layer 135, a second active pattern ACT2 of a second thin film transistor TFT2, an insulating pattern IP, a third gate pattern, a second interlayer insulating layer 140, a first data pattern, a first via insulating layer 150, a second data pattern, a second via insulating layer 160, a pixel defining layer PDL, a light emitting structure 180, and a thin film encapsulation layer TFE.

The first gate pattern may include a first gate electrode GE1. The second gate pattern may include a storage electrode CE and the ring dummy pattern RD. The ring dummy pattern RD may have a ring shape with a central hole in a plan view.

The first data pattern may include a first source electrode SE1, a first drain electrode DE1, a second source electrode SE2, and a second drain electrode DE2. The second data pattern may include a connecting electrode SD2.

As described above, the number of the ring dummy patterns through which the contact holes pass can be variously set as desired.

Figure 8A:
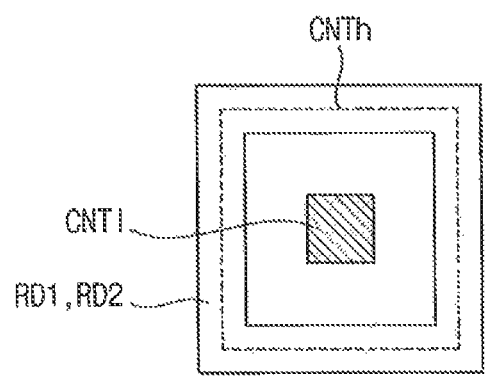
FIGS. 8A and 8B are a plan views illustrating examples of a contact hole and first and second ring dummy patterns of the display apparatus of FIG. 5.
Figure 8B:
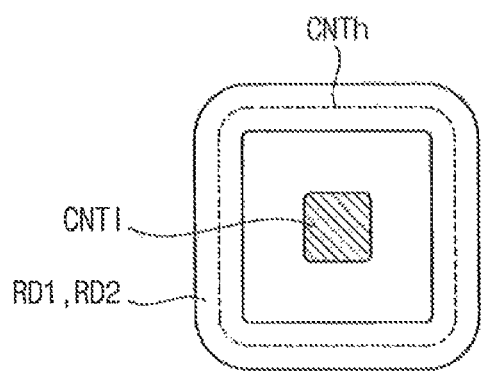

FIGS. 8A and 8B are a plan views illustrating examples of a contact hole CNT and first and second ring dummy pattern RD1 and RD2 of the display apparatus of FIG. 5.

Referring to FIGS. 5, 8A, and 8B, a shape of the contact hole CNT and the first and second ring dummy patterns RD1 and RD2 of the display apparatus may be various. For example, the shape of the contact hole CNT and the first and second ring dummy patterns RD1 and RD2 may be a quadrangular or rounded quadrilateral ring shape. In some embodiments of the inventive concept, the first and second ring dummy patterns RD1 and RD2 may be in the form of a circular ring as shown in FIG. 2A or 2B.

Additionally, in a plan view of FIGS. 8A and 8B, the upper periphery CNTh of the contact hole CNT is shown to be larger than the inner circumference of the first and second ring dummy patterns RD1 and RD2, but is not limited thereto. In addition, the lower portion of the contact hole CNT1 is disposed inside the inner circumference of the first and second ring dummy patterns RD1 and RD2.

Figure 9:
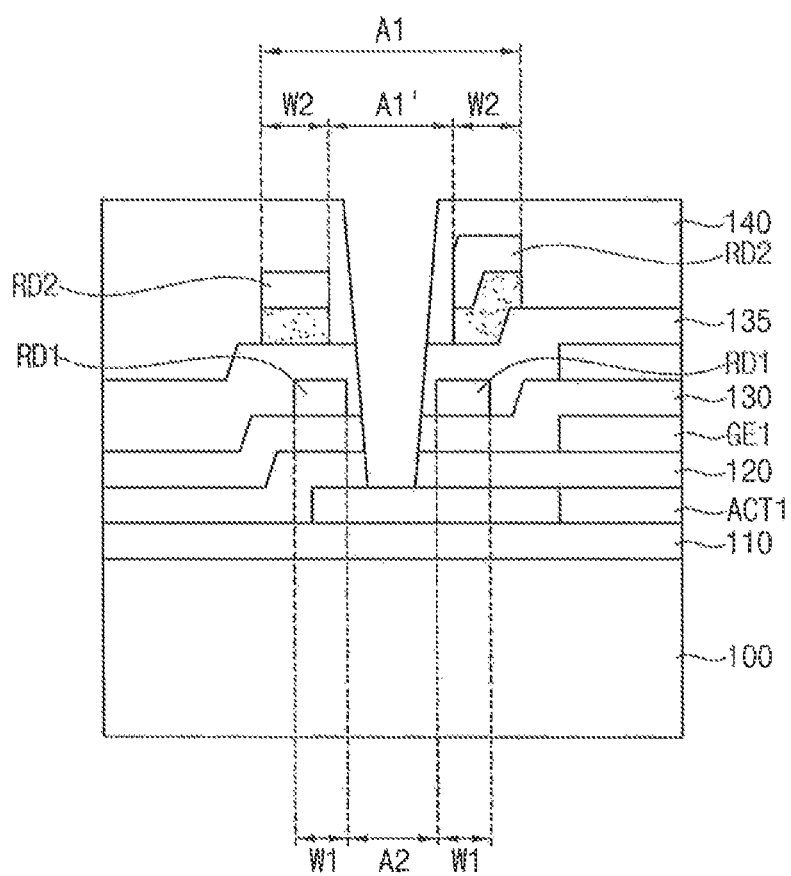
FIG. 9 is a partial cross-sectional view for explaining positions and sizes of the contact holes, and the first and second ring dummy patterns of a display apparatus according to an exemplary embodiment of the inventive concept.

FIG. 9 is a partial cross-sectional view for explaining positions and sizes of the contact holes CNT, the first and second ring dummy patterns RD1 and RD2 of a display apparatus according to an exemplary embodiment of the inventive concept.

Referring to FIG. 9, the display apparatus is substantially the same as the display apparatus of FIG. 5 except for a size of the second ring dummy pattern RD2. Therefore, repeated explanations will be omitted.

A width A2 of an inner circumference of the first ring dummy pattern RD1 is smaller than a width A1' of the inner circumference of the second ring dummy pattern RD2. A width W2 of a ring of the second ring dummy pattern RD2 is larger than a width W1 of a ring of the first ring dummy pattern RD1. Therefore, a width A1 of an outer circumference of the second ring dummy pattern RD2 may be larger than a width of an outer circumference of the first ring dummy pattern RD1. In addition, the first ring dummy pattern RD1 and the second ring dummy pattern RD2 on respective sides of the contact hole CNT may overlap each other.

Since a contact hole CNT has an inverted tapered shape in a cross section, the width A2 of the inner circumference of the first ring dummy pattern RD1 is smaller than the width A1' of the inner circumference of the second ring dummy pattern RD2. The width W1 of the ring of the first ring dummy pattern RD1 may be smaller than the width W2 of the ring of the second ring dummy pattern RD2. Accordingly, a short-circuit defect can be prevented while a distance between the contact hole CNT and the first gate electrode GE1 is narrowed.

FIGS. 10A to 10D are cross-sectional views illustrating a manufacturing method of the display apparatus of FIG. 1.

Figure 10A:
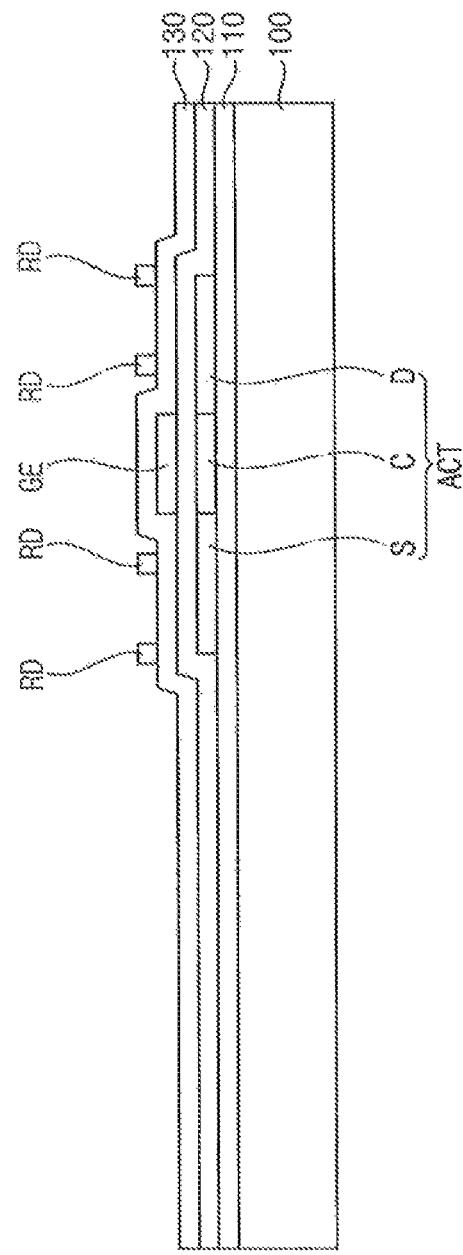

Referring to FIG. 10A, a buffer layer 110 may be formed on a base substrate 100. An active pattern ACT may be formed on the buffer layer 110. A first gate insulating layer 120 may be formed on the buffer layer 110 on which the active pattern ACT is formed. A first gate pattern including a gate electrode GE may be formed on the first gate insulating layer 120. A second gate insulating layer 130 may be formed on the first gate insulating layer 120 on which the gate electrode GE is formed. A second gate pattern including a ring dummy pattern RD may be formed on the second gate insulating layer 130.

Referring to FIG. 10B, an interlayer insulating layer 140 may be formed on the second gate insulating layer 130 on which the second gate pattern is formed.

Referring to FIG. 10C, the interlayer insulating layer 140, the ring dummy pattern RD, the second gate insulating layer 130, and the first gate insulating layer 120 are sequentially penetrated, so that a contact hole CNT exposing source or drain regions S and D of the active pattern ACT can be formed.

Figure 10D:
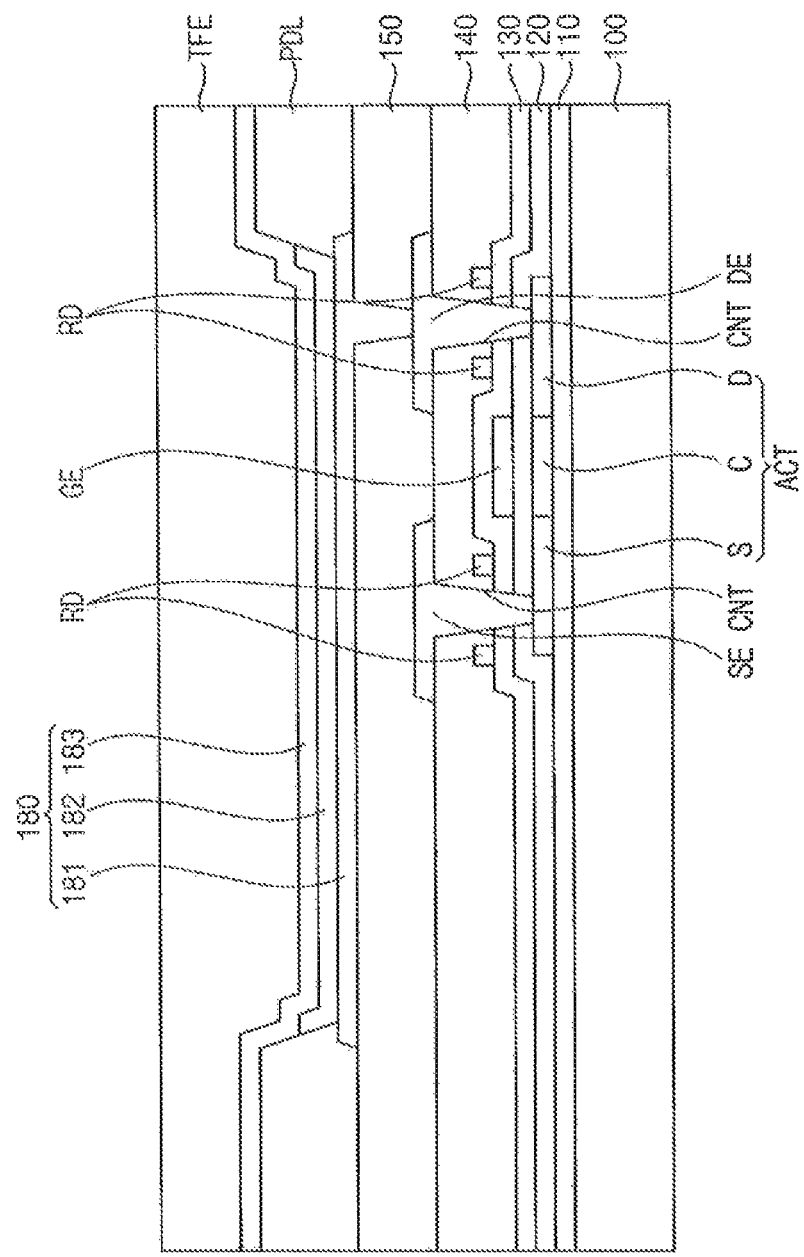

Referring to FIG. 10D, a data pattern including a source electrode SE and a drain electrode DE may be formed on the interlayer insulating layer 140 in which the contact hole CNT is formed. A via insulating layer 150 may be formed on the interlayer insulating layer 140 on which the data pattern is formed, and the via insulating layer 150 may include a contact hole exposing the drain electrode DE. A first electrode 181, a pixel defining layer PDL, a light emitting layer 182, a second electrode 183 and a thin film encapsulation layer TFE are sequentially formed on the via insulating layer 150, so that the display apparatus can be manufactured. A variety of methods can be used for manufacturing the respective components of the display apparatus.

FIGS. 11A to 11D are cross-sectional views illustrating a manufacturing method of the display apparatus of FIG. 5.

Figure 11A:
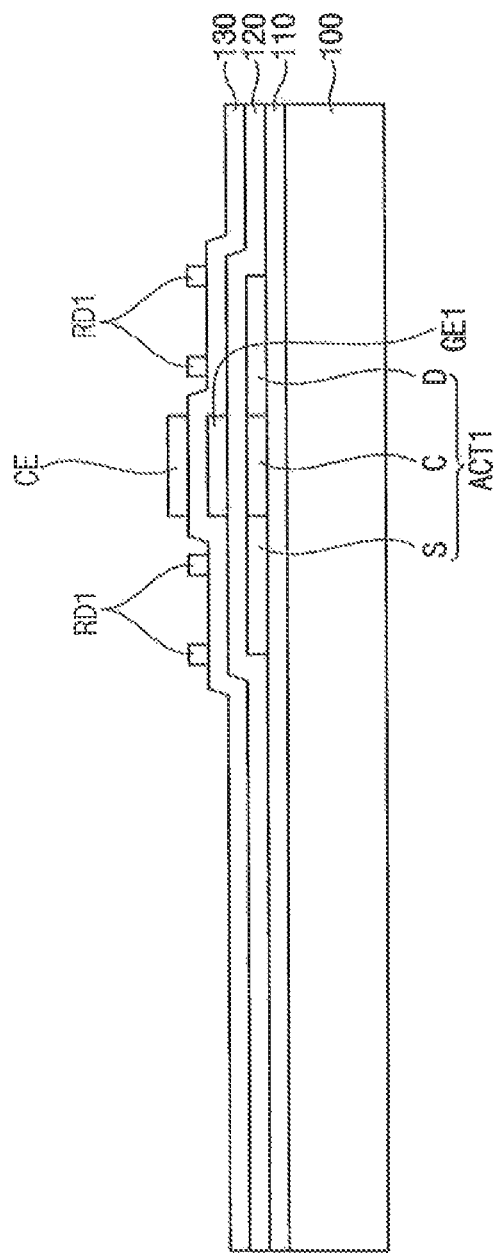

Referring to FIG. 11A, a buffer layer 110 may be formed on a base substrate 100. A first active pattern ACT1 may be formed on the buffer layer 110. A first gate insulating layer 120 may be formed on the buffer layer 110 on which the first active pattern ACT1 is formed. A first gate pattern including a first gate electrode GE1 may be formed on the first gate insulating layer 120. A second gate insulating layer 130 may be formed on the first gate insulating layer 120 on which the first gate electrode GE1 is formed. A second gate pattern including a first ring dummy pattern RD1 and a storage electrode CE may be formed on the second gate insulating layer 130.

Figure 11B:
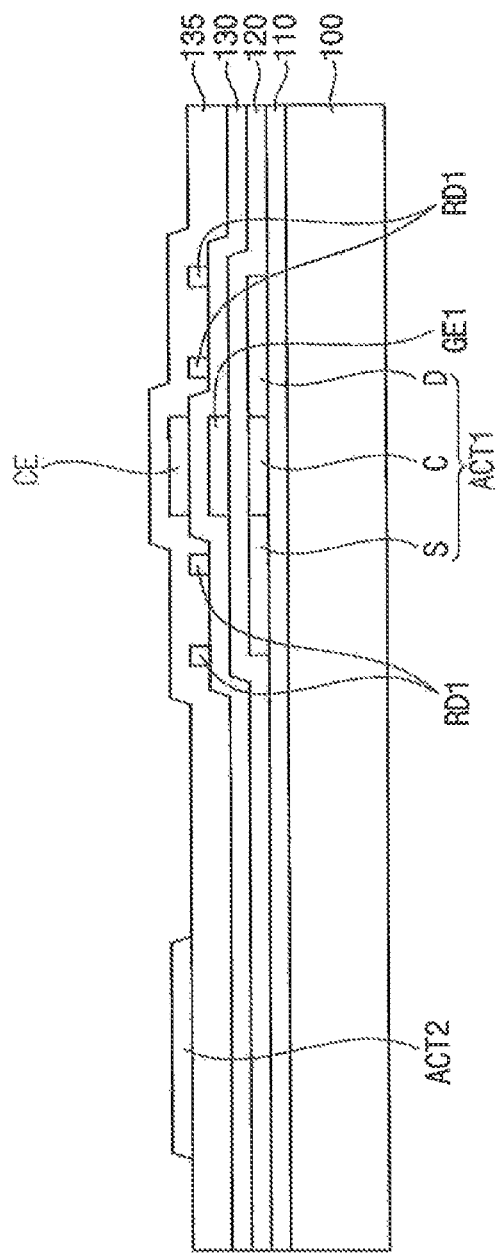

Referring to FIG. 11B, a first interlayer insulating layer 135 may be formed on the second gate insulating layer 130 on which the second gate pattern is formed. A second active pattern ACT2 may be formed on the first interlayer insulating layer 135

Referring to FIG. 11C, an insulating layer and a conductive layer may be sequentially formed on the first interlayer insulating layer 135 on which the second active pattern ACT2 is disposed, and then, the conductive layer and the insulating layer may be patterned to form an insulating pattern IP and a second gate pattern on the insulating pattern IP. The second gate pattern may include a second gate electrode GE2 and a second ring dummy pattern RD2.

Figure 11D:
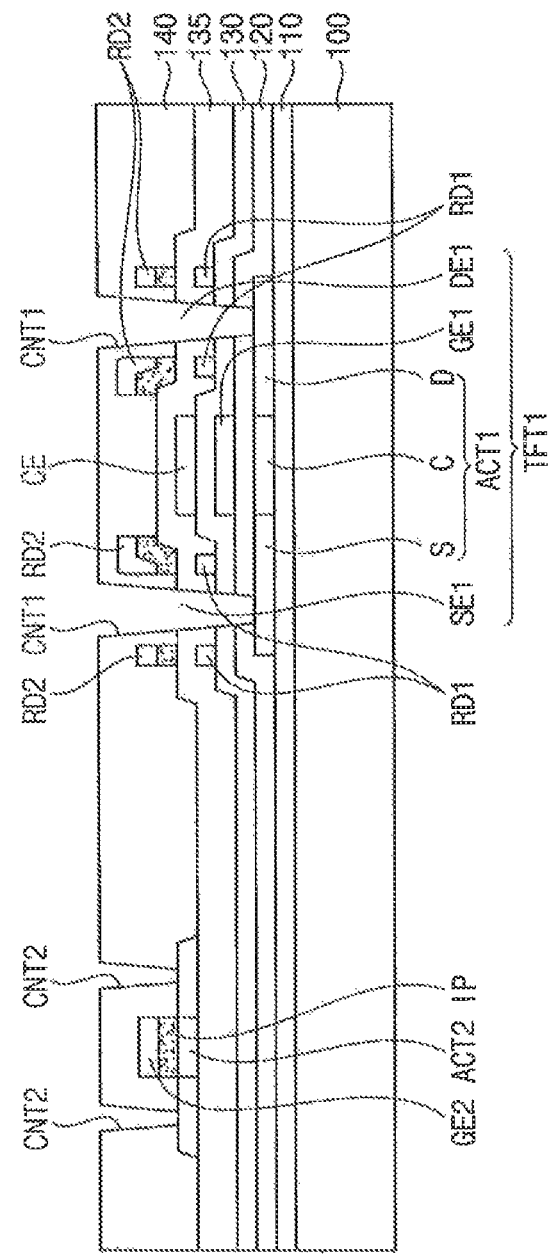

Referring to FIG. 11D, a second interlayer insulating layer 140 may be formed on the first interlayer insulating layer 135 on which the second gate pattern is formed.

A first contact hole CNT1 which exposes a source or drain region S or D of the first active pattern ACT1 may be formed through the second interlayer insulating layer 140, a hole of the second ring dummy pattern RD2, the first interlayer insulating layer 135, a hole of the first ring dummy pattern RD1, the second gate insulating layer 130 and the first gate insulating layer 120 in order.

In addition, the second interlayer insulating layer 140 may be partly removed to form a second contact hole CNT2 exposing a source or drain region S or D of the second active pattern ACT2. The first contact hole CNT1 and the second contact hole CNT2 may be formed simultaneously using a halftone mask or may be formed separately using a separate mask.

Referring to FIG. 11D and FIG. 5, a first data pattern including a first source electrode SE1, a first drain electrode DE1, a second source electrode SE2, and a second drain electrode DE2 may be formed on the second interlayer insulating layer 140 through which the first and second contact holes CNT1 and CNT2 are formed. A first via insulating layer 150 through which a contact hole exposing the first drain electrode DE1 is formed may be formed on the interlayer insulating layer 140 on which the first data pattern is formed. A second data pattern including a connecting electrode SD2 may be formed on the first via insulating layer 150. A second via insulating layer 160 may be formed on the first via insulating layer 150 on which the second data pattern is formed. A first electrode 181, a pixel defining layer PDL, a light emitting layer 182, a second electrode 183 and a thin film encapsulation layer TFE may be sequentially formed on the second via insulating layer 160, so that the display apparatus can be manufactured. A variety of methods can be used for manufacturing the respective components of the display apparatus.

According to the embodiments of the inventive concept, since the ring dummy patterns RD, RD1 and RD2 can guide formation positions of the contact holes CNT and CNT1, a margin can be ensured, and a circuit design with a finer structure is possible.

FIGS. 12A to 12E are plan views showing wiring layout of one pixel of a display apparatus according to an exemplary embodiment of the inventive concept.

Referring to FIG. 12A to 12E, the display apparatus may have a planar layout as shown in the drawings to implement a pixel structure according to an exemplary embodiment of the present inventive concept.

A first active pattern ACT1 may include source, drain, and channel regions of the first thin film transistor TFT1 included in the pixel structure. A first gate pattern GAT1 may include signal wiring such as a gate electrode of the first thin film transistor TFT1, a storage electrode of a storage capacitor, a gate line, or the like. A second gate pattern GAT2 may comprise another storage electrode of the storage capacitor. A second active pattern ACT2 may include source, drain, and channel regions of the second thin film transistor TFT2 included in the pixel structure. A third gate pattern GAT3 may include signal wiring such as a ring dummy pattern RD, a light emission control line, and the like. A first data pattern SD1 may include signal wiring such as an electrode EE and a data line.

Figure 12A:
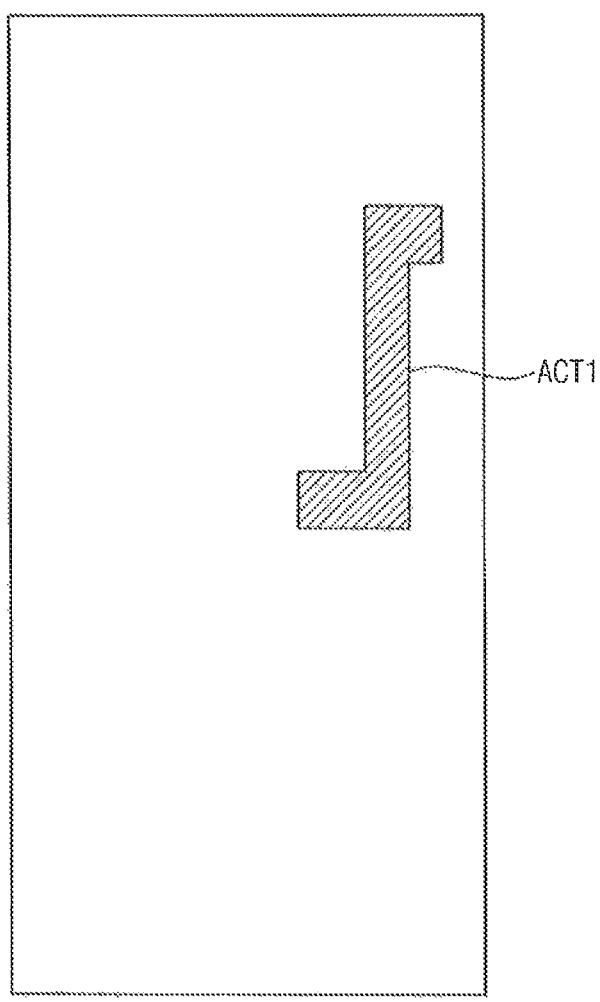
FIGS. 12A, 12B, 12C, 12D and 12E are plan views showing a wiring layout of one pixel of a display apparatus according to an exemplary embodiment of the inventive concept.
Figure 12B:
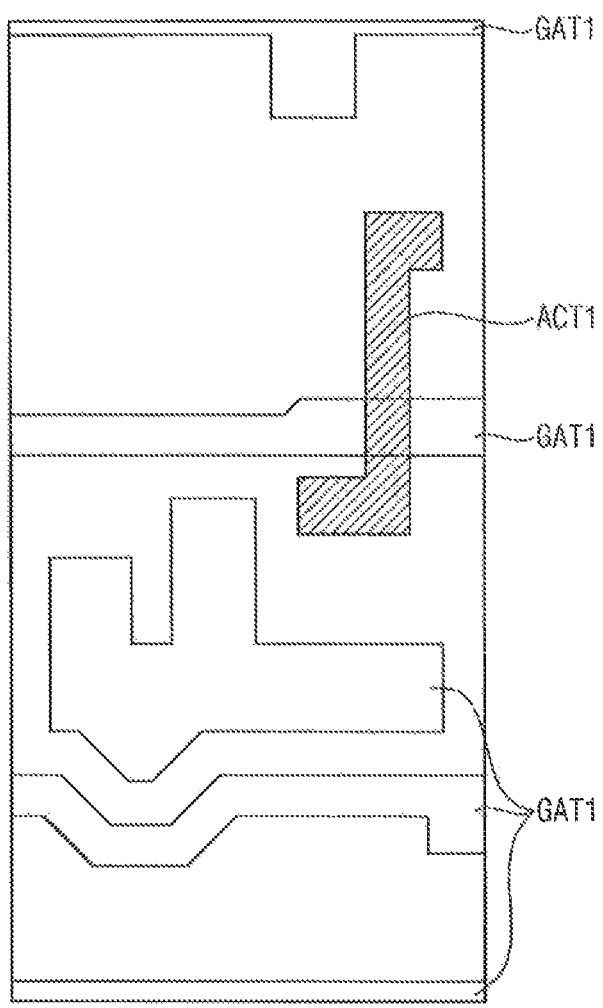
Figure 12C:
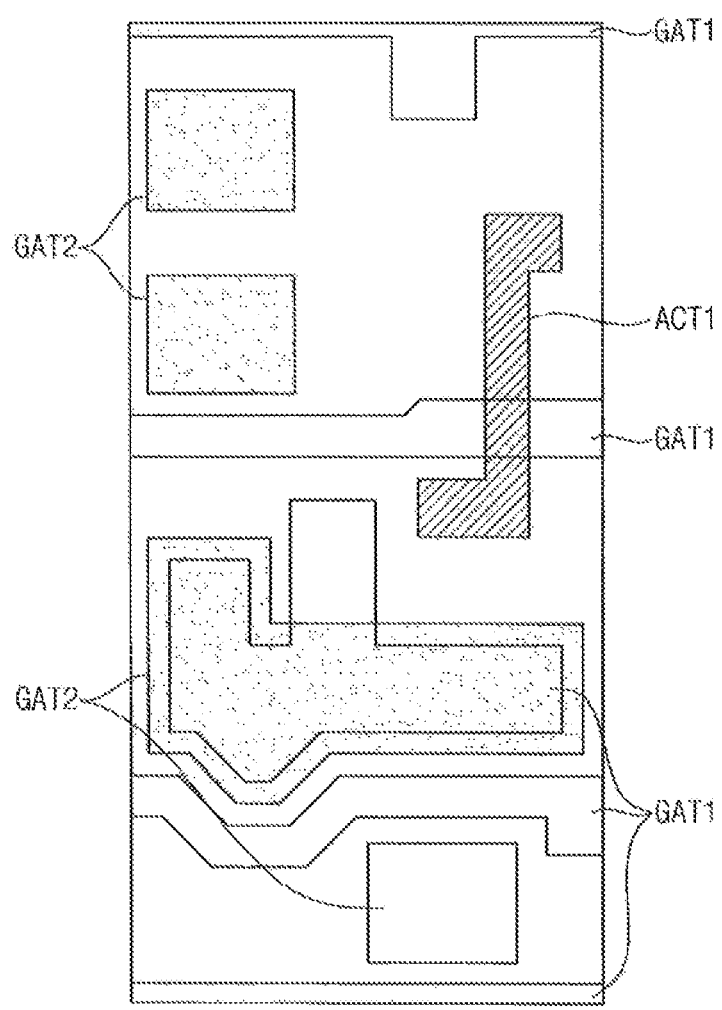
Figure 12D:
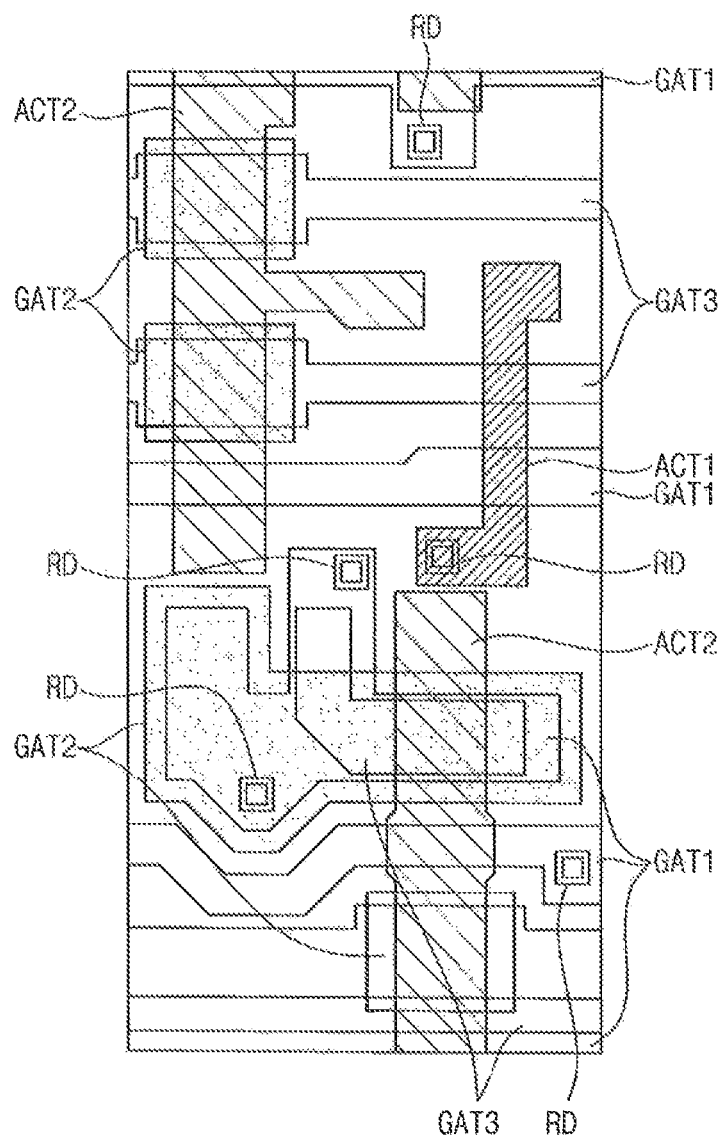
Figure 12E:
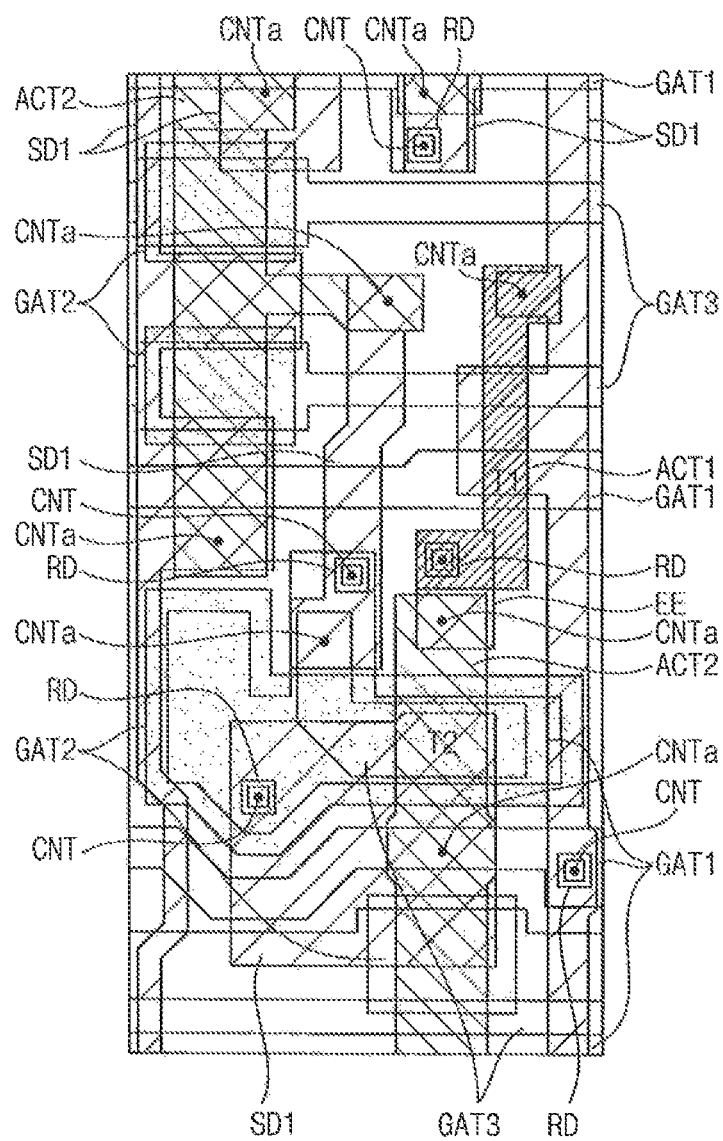

In FIG. 12E, the first data pattern SD1 may be connected to another wiring layer through a contact hole CNT through the ring dummy pattern RD or a contact hole CNTa without a ring dummy pattern. The contact hole CNT is a contact hole having a relatively deep depth and is formed between the first data pattern SD1 and the first active pattern ACT1 and between the first data pattern SD1 and the first gate pattern GAT1, or between the first data pattern SD1 and the second gate pattern GAT2. In this case, the contact hole CNT has a relatively deep depth but is formed to pass through the ring dummy pattern RD, and even if the ring dummy pattern RD is slightly displaced from a designed formation position of the contact hole CNT as described above, it is possible to prevent a short-circuit failure between adjacent wirings. For detail about preventing the short-circuit failure between adjacent wiring please refer to the explanation above for FIG. 7.

Particularly, in the case of two contact holes adjacent to each other (for example, two contact holes CNT and CNTa of the electrode EE), one passes through the ring dummy pattern RD and the other does not pass through the ring dummy pattern RD. Thus, a gap between the two contact holes CNT and CNTa can be narrowed, a design margin can be ensured, and thus, a short-circuit failure can be prevented.

Specifically, the first thin film transistor TFT1 including polysilicon is connected to the electrode EE of the first data pattern SD1 through the contact hole CNT passing through the ring dummy pattern RD. Therefore, the electrode EE may be connected to the second thin film transistor TFT2 including an oxide semiconductor through the contact hole CNTa without passing a ring dummy pattern.

It is to be understood that the layout of the pixel structure shown in FIGS. 12A to 12E, corresponds to an exemplary embodiment of the inventive concept, but the pixel structure of the display apparatus according to the present inventive concept is not limited thereto.

Figure 14A:
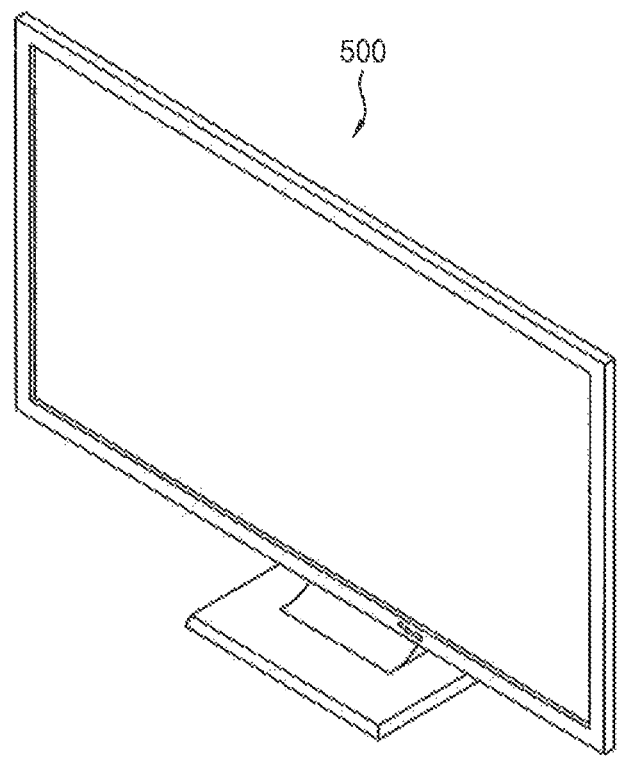
FIG. 14A is a diagram illustrating an example in which the electronic device of FIG. 13 is implemented as a television.
Figure 14B:
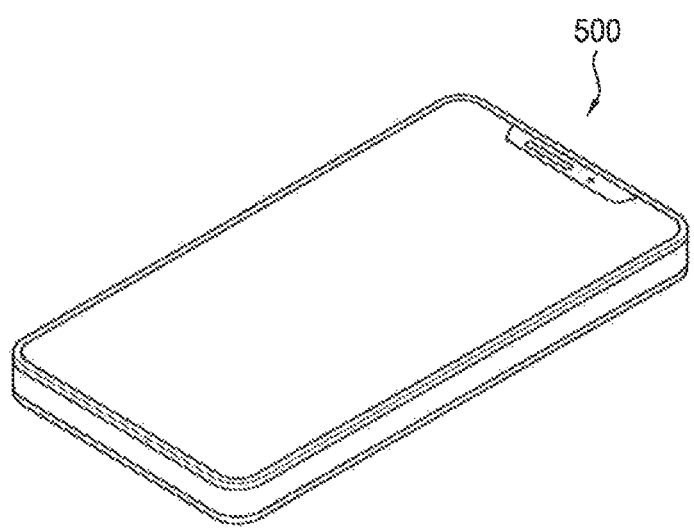
FIG. 14B is a diagram illustrating an example in which the electronic device of FIG. 13 is implemented as a smart phone.

FIG. 13 is a block diagram illustrating an electronic device according to exemplary embodiments of the inventive concept. FIG. 14A is a diagram illustrating an example in which the electronic device of FIG. 13 is implemented as a television. FIG. 14B is a diagram illustrating an example in which the electronic device of FIG. 13 is implemented as a smart phone.

Referring to FIGS. 13 through 14B, the electronic device 500 may include a processor 510, a memory device 520, a storage device 530, an input/output (I/O) device 540, a power supply 550, and a display device 560. Here, the display device 560 may correspond to the display apparatus of FIG. 1. In addition, the electronic device 500 may further include a plurality of ports for communicating with a video card, a sound card, a memory card, a universal serial bus (USB) device, other electronic devices, etc. In an exemplary embodiment of the inventive concept, as illustrated in FIG. 14A, the electronic device 500 may be implemented as a television. In another exemplary embodiment of the inventive concept, as illustrated in FIG. 14B, the electronic device 500 may be implemented as a smart phone. However, the electronic device 500 is not limited thereto. For example, the electronic device 500 may be implemented as a cellular phone, a video phone, a smart pad, a smart watch, a tablet personal computer (PC), a car navigation system, a computer monitor, a laptop, a head mounted display (HMD), etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a compact disk-read only memory (CD-ROM) device, etc. The I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The display device 560 may be coupled to other components via the buses or other communication links. In some exemplary embodiments of the inventive concept, the display device 560 may be included in the I/O device 540. As described above, since the display device 560 includes a ring dummy pattern and a contact hole formed through the ring dummy pattern, the display device 560 can have a detailed circuit pattern and can prevent a short-circuit failure.

Exemplary embodiments of the present inventive concept can be applied to organic light emitting display devices and various electronic devices including the same. For example, exemplary embodiments of the present inventive concept can be applied to a mobile phone, a smart phone, a video phone, a smart pad, a smart watch, a tablet PC, a car navigation system, a television, a computer monitor, a notebook, and the like.

One or more exemplary embodiments of the inventive concept provides a display apparatus having a contact hole structure capable of forming a fine pattern with a sufficient process margin without an additional process.

One or more exemplary embodiments of the inventive concept also provide a method of manufacturing the display apparatus.

According to the exemplary embodiments of the present inventive concept, the display apparatus includes a ring dummy pattern that can prevent a short-circuit failure or the like in a process of forming a contact hole. Thus, it is possible to prevent a short-circuit failure due to a process error of forming the contact hole, despite the process error of forming the contact hole.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A display apparatus, comprising:
   a base substrate;
   a first active pattern disposed on the base substrate, a first insulating layer disposed on the first active pattern;
   a first gate electrode disposed on the first insulating layer;
   a second insulating layer disposed on the first gate electrode;
   a first ring dummy pattern disposed on the second insulating layer;
   a third insulating layer disposed on the second insulating layer; and
   a first drain electrode disposed on the third insulating layer, and electrically connected to the first active pattern through a first contact hole which is formed through the third insulating layer, the second insulating layer and the first insulating layer, wherein the first drain electrode is disposed in an opening of the first ring dummy pattern,
   wherein a periphery of an upper portion of the first contact hole overlaps at least a portion of the first ring dummy pattern in a plan view.

2. The display apparatus of claim 1, wherein the periphery of the upper portion of the first contact hole is larger than an inner circumference of the first ring dummy pattern, and smaller than an outer circumference of the first ring dummy pattern.

3. The display apparatus of claim 1, wherein the first drain electrode and the first ring dummy pattern contact each other.

4. The display apparatus of claim 1, wherein the first ring dummy pattern partially overlaps the first gate electrode.

5. The display apparatus of claim 1, wherein a periphery of a lower portion of the first contact hole is located in the first ring dummy pattern in a plan view.

6. The display apparatus of claim 1, wherein the first contact hole has a shape of a circle, a rectangle, or a square with rounded corners in a plan view, and
   the first ring dummy pattern has a shape of a circle, a rectangle, or a square with rounded corners in a plan view.

7. The display apparatus of claim 1, further comprising:
   a first interlayer insulating layer disposed between the second insulating layer and the third insulating layer;
   a second active pattern disposed between the first interlayer insulating layer and the third insulating layer; and
   a second gate electrode disposed on the second active pattern.

8. The display apparatus of claim 7, wherein a sum of thicknesses of the first insulating layer, the second insulating layer, the first interlayer insulating layer and the third insulating layer is not less than 10,000 Å.

9. The display apparatus of claim 7, further comprising:
   a second ring dummy pattern disposed between the first interlayer insulating layer and the third insulating layer and overlapping the first ring dummy pattern.

10. The display apparatus of claim 9, further comprising:
    an insulating pattern disposed between the second ring dummy pattern and the first interlayer insulating layer and between the second gate electrode and the first interlayer insulating layer.

11. The display apparatus of claim 10, wherein a width of an inner circumference of the second ring dummy pattern is larger than a width of an inner circumference of the first ring dummy pattern.

12. The display apparatus of claim 1, further comprising:
    a storage electrode overlapping the first gate electrode and spaced apart from the first ring dummy pattern.

13. The display apparatus of claim 1, further comprising:
    interlayer insulating layer disposed between the third insulating layer and the second insulating layer; and
    a storage electrode disposed between the interlayer insulating layer and the second insulating layer and overlapping the first gate electrode, and
    wherein the first ring dummy pattern is disposed between the interlayer insulating layer and the third insulating layer.

14. The display apparatus of claim 1, further comprising:
    an interlayer insulating layer disposed between the third insulating layer and the second insulating layer;
    a storage electrode disposed between the interlayer insulating layer and the second insulating layer and overlapping the first gate electrode, and
    wherein the ring dummy pattern is disposed between the interlayer insulating layer and the second insulating layer, and in the same layer as the storage electrode.

15. The display apparatus of claim 1, further comprising:
    a via insulating layer disposed on the third insulating layer; and
    a light emitting layer disposed on the via insulating layer.

16. The display apparatus of claim 7, wherein the first drain electrode is electrically connected to the second active pattern through a second contact hole formed through the third insulating layer,
    the first contact hole and the second contact hole are disposed adjacent to each other in a plan view and
    the second contact hole is not provided with the first ring dummy pattern corresponding to the first contact hole.

17. A display apparatus, comprising:
    a base substrate;
    a first conductive pattern disposed on the base substrate;
    a first insulating layer disposed on the first conductive pattern;
    a second conductive pattern disposed on the first insulating layer;
    a second insulating layer disposed on second conductive pattern;
    a ring dummy pattern disposed on the second insulating layer and at least partially overlapping the second conductive pattern, wherein the second conductive pattern at least partially overlapped by the ring dummy pattern is a gate electrode;
    a third insulating layer disposed on the ring dummy pattern; and
    a third conductive pattern disposed on the third insulating layer, wherein a contact hole is formed through the third insulating layer, the second insulating layer, and the first insulating layer, the contact hole passes through an opening of the ring dummy pattern, and the third conductive pattern is disposed in the contact hole, and is electrically connected to the first conductive pattern.

18. The display apparatus of claim 17, wherein a periphery of an upper portion of the contact hole does not overlap the ring dummy pattern.

19. The display apparatus of claim 17, wherein the ring dummy pattern and the third conductive pattern do not contact each other.

20. A display apparatus, comprising:
a base substrate;
an active pattern disposed on the base substrate, a first insulating layer disposed on the active pattern;
a gate electrode disposed on the first insulating layer;
a second insulating layer disposed on the gate electrode;
a ring dummy pattern disposed on the second insulating layer and at least partially overlapping the gate electrode;
a third insulating layer disposed on the second insulating layer;
a drain electrode disposed on the third insulating layer, and electrically connected to the active pattern through a contact hole which is formed through the third insulating layer, the second insulating layer and the first insulating layer, wherein the drain electrode is disposed in an opening of the ring dummy pattern.

* * * * *